United States Patent [19]
Evans et al.

[11] Patent Number: 6,021,214
[45] Date of Patent: Feb. 1, 2000

[54] INSPECTION METHOD AND APPARATUS FOR THE INSPECTION OF EITHER RANDOM OR REPEATING PATTERNS

[75] Inventors: David M. W. Evans, Braddon, Australia; Bin-Ming Ben Tsai, San Jose; Jason Z. Lin, Saratoga, both of Calif.

[73] Assignee: KLA Instruments Corp., San Jose, Calif.

[21] Appl. No.: 08/524,608

[22] Filed: Sep. 7, 1995

Related U.S. Application Data

[62] Division of application No. 08/129,341, Sep. 30, 1993, Pat. No. 5,537,669.

[51] Int. Cl.$^7$ ........................................ G06K 9/00
[52] U.S. Cl. ............................. 382/141; 382/172
[58] Field of Search .................... 382/141, 149, 382/168, 170, 172

[56] References Cited

U.S. PATENT DOCUMENTS

| | | |
|---|---|---|
| 4,330,775 | 5/1982 | Iwamoto et al. . |
| 4,806,774 | 2/1989 | Lin et al. .............................. 250/550 |
| 4,975,972 | 12/1990 | Bose et al. . |
| 5,249,238 | 9/1993 | Komerath et al. . |

*Primary Examiner*—Phuoc Tran
*Attorney, Agent, or Firm*—Allston L. Jones

[57] ABSTRACT

The present invention is a hybrid technique for finding defects on digitized device images using a combination of spatial domain and frequency domain techniques. The two dimensional spectra of two images are found using Fourier like transforms. Any strong harmonics in the spectra are removed, using the same spectral filter on both spectra. The images are then aligned, transformed back to the spatial domain, and subtracted. The resulting spectrally-filtered difference image is thresholded and analyzed for defects. Use of the hybrid technique of the present invention to process digitized images results in the highest-performance and most flexible defect detection system. It is the best performer on both array and random devices, and it can cope with problems such as shading variations and the dark-bright problem that no other technique can address. The hybrid technique of the present invention also uses frequency domain techniques to align the images with fewer errors than spatial domain techniques of similar or lesser complexity. Further, the relative offsets of the pairs of images are determined by frequency domain techniques—and this method may be the most accurate and the least expensive.

4 Claims, 13 Drawing Sheets

INSPECTION METHOD AND APPARATUS FOR THE INSPECTION OF EITHER RANDOM OR REPEATING PATTERNS

This is a divisional of application Ser. No. 08/129,341, filed on Sep. 30, 1993, now U.S. Pat. No. 5,537,669.

FIELD OF THE INVENTION

The present invention is related to the inspection of a first device pattern by comparing that device pattern with a second device pattern where those patterns may be on different dies, different device patterns on the same die, repeating patterns within the same device, on paper, or stored in memory. More particularly, the present invention relates to device pattern inspection where the pattern to be inspected is a random pattern, a repeating pattern, or a combination of the two.

BACKGROUND OF THE INVENTION

The types of patterns that are found on devices, particularly those in the production of semiconductor devices, are categorized as either random, repeating, or a combination of the two. This categorization is important in that, historically, random and repeating patterns have been inspected optically in the spatial domain, whereas repeating patterns are more easily inspected in the frequency domain. Also, in the early semiconductor technologies the repeating pattern was not readily used. More recently, with the advent of VLSI technologies, memory arrays have become quite common, and therefore of interest in the rapid inspection of devices with repeating patterns.

There are numerous techniques used for spatial optical inspection of a first device by means of comparison of that device with a second device. These techniques use either a real second device, or the desired attributes of the device to be inspected stored in memory, against which the first device is compared. Where a real device is used for the comparison, there are a variety of techniques that permit one to compare the first device against a separate second device, to compare two dies on the same device, or to compare repeating arrays within the same die.

In each comparison it is noted whether the devices are the same, within any selected tolerances, or whether they are different. Typically, the second device then becomes the first and a third becomes the second and another comparison is performed again noting whether they are the same or different. In this way it is possible to determine which of the devices are good and which ones are bad since it is presumed that the majority of devices will be good, therefore those which are not in that group are presumed to be defective.

Most of the high speed inspection systems that are currently available inspect the pattern in the spatial domain, no matter what the characteristics of the pattern are. However, the inspection of repeating patterns, but not random patterns, is greatly facilitated by the performance of the inspection in the frequency domain.

In order to improve the inspection time of repeating patterns, In-Systems, Inc. developed an entirely optical technique that uses a special lens system that is device specific (U.S. Pat. No. 4,806,774, issued Feb. 21, 1989). This system projects a two dimensional image through a lens which yields a Fourier transform of that image in the back aperture plane. Then, through the use of a hologram that is specific to the repeating pattern of the device being inspected, the In-Systems method filters out the harmonic frequencies from the resulting frequency domain image of the device, thus removing the frequency domain attributes of any repeating pattern from the other features of the device that is being inspected.

The In-Systems inspection system does the inspection entirely optically. In-Systems' method passes the 2-dimensional image through a lens resulting in a two dimensional Fourier transform of the device image. That image is then directed to a photographic plate that has been developed by shining light on it from a test device, so that the higher the light intensity of the Fourier transform of the image the more that develops on the plate. The photographic plate serves as a filter that depends on the intensity of the image on the photographic plate, i.e. there is a direct correlation between the amount of light that fell on the photographic plate and the density of the image on the photographic plate. So in areas where there is a lot of density on the plate, it filters to the same extent. The In-Systems filter is limited to being just in the areas where the Fourier transform is strong which may include off harmonic areas. It is meant for harmonics but nevertheless because of the way that the filter is made it will filter out those frequencies.

The filter is developed from the light shining on it from a test device. During the inspection process, light from a device that is to be analyzed is directed through a Fourier transform structure as described above and stored in a hologram. A laser is then shone through the hologram and the same lens to cancel out any aberrations introduced by the lens. The point is that when In-Systems filters in the frequency domain they are constrained to filtering everywhere that the Fourier transform is significantly strong.

In the In-Systems optical approach the image of the device is not scanned and digitized to perform the inspection. This means that the In-Systems method described above can only look at arrays, since the transform techniques are not suitable for non-repeating patterns. If non-repeating patterns are inspected using the In-Systems approach, the spectral components in the frequency domain will be scattered and not produce a meaningful spectrum that presents a frequency pattern that can be processed.

It would be desirable to have an inspection method and apparatus that combines inspection domains to inspect each type of pattern in the domain that is more favorable to the inspection of that type of pattern. That is use the frequency domain for the inspection of the repeating patterns (which is superior to spatial domain inspection of repeating patterns) and spatial domain inspection of the random patterns (for which frequency domain inspection is unsuitable). It would be of particular interest to have an inspection method for arrays with the increased precision, flexibility and reliability of electronic digital arithmetic without the inconvenience of holograms and chemical development for the particular pattern. The present invention provides such an inspection method and apparatus.

SUMMARY OF THE INVENTION

The hybrid technique of the present invention is basically a method for finding defects on digitized device images using a combination of spatial domain and frequency domain techniques. The two dimensional spectra of two images are found using Fourier like transforms. Any strong harmonics in the spectra are removed, using the same spectral filter on both spectra. The images are then aligned, transformed back to the spatial domain, and subtracted. The resulting spectrally-filtered difference image is thresholded and analyzed for defects.

Use of the hybrid technique of the present invention to process digitized images results in the highest-performance and most flexible defect detection system. It is the best performer on both array and random devices, and it can cope with problems such as shading variations and the dark-bright problem that no other technique can address.

The hybrid technique of the present invention also uses frequency domain techniques to align the images with more precision than spatial domain techniques such as the cubic shift. Further, the relative offsets of the pairs of images are determined by frequency domain techniques—and this method may be the most accurate and the least expensive.

There are three additional major benefits from the hybrid technique of the present invention:

1. The hybrid technique automatically processes both array and random areas on the device;
2. The hybrid technique is well-suited to the bright-dark problem (the array appears dark and low-contrast if the illumination is set for random, and the random saturates the camera, or sensor, if the illumination is adjusted for repeating) because the hybrid technique is much more powerful for repeating than random; and
3. The hybrid technique can do additional frequency-domain processing virtually for free—for example, the shading problem can be solved (low frequency fluctuations across the image are eliminated by a high pass filter with a very low cut-off frequency), undesirable effects of the MTFs (modulation transfer function) of the optics and sensor may be compensated for, etc. MTF filtering is the shaping of the spectrum by multiplication with a transfer function (a function which multiples each part of the spectrum by the value of the MTF at that frequency; MTF values usually are between 0 and about 2).

DETAILED DESCRIPTION OF THE PREFERRED EMBODIMENT

Figure 1:
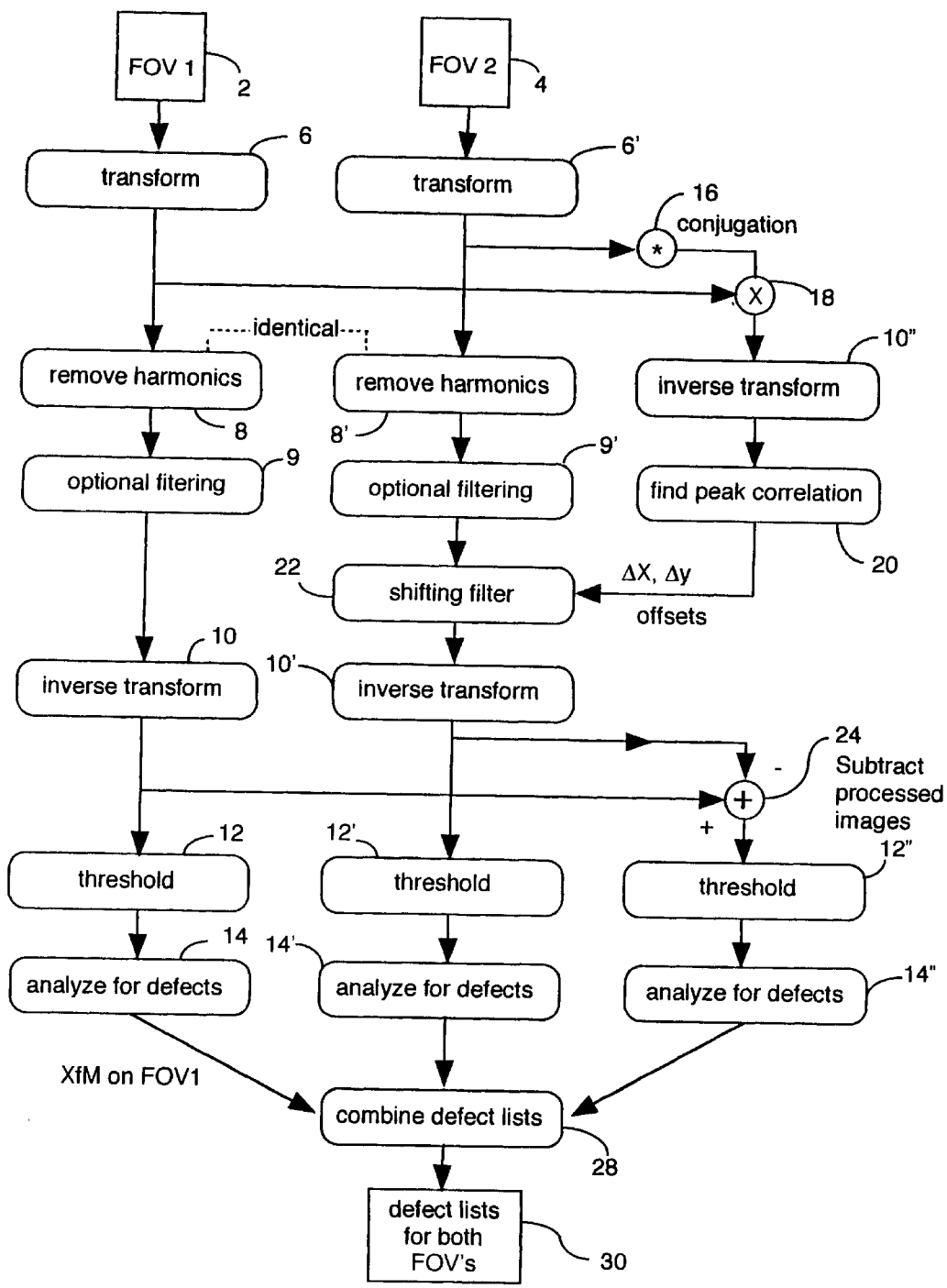
FIG. 1 is a flow chart that illustrates the basic defect identification method of the present invention.

The present invention, in order to inspect both random and repeating patterns which may or may not be present on the same device, includes electronic techniques which are capable of high speed inspection of both types of patterns.

One may think of the image of a device pattern as being a superposition of four images: a random image; a repeating image; a noise image; and a defects image. That can be represented mathematically as $$i(x,y)=rn(x,y)+rp(x,y)+n(x,y)+d(x,y)$$

where $i(x,y)$=total device image;

$rn(x,y)$=random image portion of the device;

$rp(x,y)$=repeating image portion of the device;

$n(x,y)$=noise image (due to sensor, lighting or reflective fluctuations, etc.); and $d(x,y)$=defect image or defect map (image changes due to defects).

Let the spectrum of the device image be $$I(f_X,f_Y)=RN(f_X,f_Y)+RP(f_X,f_Y)+N(f_X,f_Y)+D(f_X,f_Y)$$

where $RN(f_X,f_Y)$=the spectrum of $rn(x,y)$ $RP(f_X,f_Y)$=the spectrum of $rp(x,y)$ $N(f_X,f_Y)$=the spectrum of $n(x,y)$ $D(f_X,f_Y)$=the spectrum of $d(x,y)$ $f_X$=the frequency in the x direction $f_Y$=the frequency in the y direction The spectrum can be found by any two dimensional sinusoidal transform, such as the Fourier, Hartley or canonical transforms. Such transforms, called 'Fourier-like' transforms here, are all characterized by the fact that they represent an image as a sum of two dimensional sinusoids, that is, they transform an image in x and y into a number of sinusoidally-varying functions of x and y that, when all added together, are equal to the image.

Suppose that the repeating pattern has the periods $T_X$ and $T_Y$ in the x and y directions. Then the spectrum of $rp(x,y)$ will consist entirely of two-dimensional sinusoids that repeat with one of these periods, that is, $RP(f_X,f_Y)$ will be entirely at the frequencies $(f_X,f_Y)$, where either $f_X \in \{0, 1/T_X, 2/T_X, \ldots\}$ or $f_Y \in \{0, 1/T_Y, 2/T_Y, \ldots\}$. Therefore trimming $I(f_X,f_Y)$ by removing (zeroing out) all components at these frequencies will remove $RP(f_X,f_Y)$ from $I(f_X,f_Y)$. Since the trimmed frequencies form only a small portion of the total number of two dimensional frequencies it is expected that trimming will have only a minor effect on $RN(f_X,f_Y)$, $N(f_X,f_Y)$ and $D(f_X,f_Y)$, which are assumed to be spread with equal probability across all frequencies in any small area of the spectrum.

Thus the trimmed spectrum of the device image is $$I'(f_X,f_Y)=RN'(f_X,f_Y)+N'(f_X,f_Y)+D'(f_X,f_Y)$$

where

RN'($f_X,f_Y$)=the trimmed spectrum of rn(x,y)=the spectrum of rn'(x,y)≈RN($f_X,f_Y$)

N'($f_X,f_Y$)=the trimmed spectrum of n(x,y)=the spectrum of n'(x,y)≈N($f_X,f_Y$)

D'($f_X,f_Y$)=the trimmed spectrum of d(x,y)=the spectrum of d'(x,y)≈D($f_X,f_Y$).

When I'($f_X,f_Y$) is inverted (by applying the inverse of the two dimensional transform previously described) the resulting processed image is $$p(x,y)=rn'(x,y)+n'(x,y)+d'(x,y)\approx rn(x,y)+n(x,y)+d(x,y),$$

and the repeating pattern has been successfully separated from the non-repeating parts of the device image i(x,y).

If the signal to noise ratio (SNR) of the device image i(x,y), where the defect image d(x,y) is the signal and the noise is n(x,y) (and where rn(x,y) is virtually non-existent), is sufficiently high, then the defect image peaks (the defects) can be separated from the noise by thresholding and/or pattern classification techniques, leaving the image d'(x,y)≈d(x,y).

The input images may be of any size. It is most convenient for digitally performing the 2-dimensional transforms if they have heights and widths that are powers of two, such as 256×512, or at least that are the products of many smaller factors, such as 480×480. Each pixel in the image is a number representing the intensity of the image, and typically the pixels consist of eight-bit data (256 grey levels). A crucial consideration in any digital implementation is the method of finding the spectrum of the image. Traditional methods of finding the spectrum of a digital image introduce two serious sources of noise. This noise, which is introduced by the transforming technique and is not present in the original image, necessarily lowers the sensitivity of the method. These two sources of transform noise are zero-padding of the image and period mismatch.

Zero-Padding Adds Noise

Usually digital transforms have been constrained to images whose dimensions are powers of two, and when the dimensions of the image have not been powers of two either some of the image was discarded or more pixels were added to the image and filled with arbitrary numbers, usually zeroes. Thus the usual approaches to finding the spectrum of a 480×480 image would have been either to take a 256×256 transform of part of the image, and thus obtain the exact spectrum of $$(256)^2/(480)^2=28.44\%$$

of the image, or to add $$(512)^2-(480)^2=31,744$$

extra pixels with grey level zero to bring the image size up to 512×512, and then take a transform to find the exact spectrum of an image which has $$31,744/(512)^2=12.11\%$$

of its contents incorrect (set to an arbitrary value that is independent of the data, and not containing a repeating array). The last approach clearly introduces a lot of extra noise into the spectrum, thus decreasing the SNR considerably and reducing the ability of the transform method to separate the noise from the defects.

A better, but impractically difficult, approach is to increase the size of the image using a repeating pattern from somewhere else in the image, but unless this was done perfectly (which would require exact period estimation, sub-pixel alignment and perfect, noise-free interpolation) it would still add considerable noise.

A still better approach is to use a transform technique that can take the transform of a 480×480 image directly, thus giving the exact discrete spectrum of the whole image. Such transforms do exist in the literature. They are all either special purpose transforms that can transform just a few image sizes, or are general purpose to the point where they can transform images whose dimensions have prime factorizations containing the numbers $\{2,3\ldots,N_{max}\}$ where $N_{max}$ can be up to about 17, but are considerably slower than the powers of two transforms and/or take a lot of memory to compute.

Not Matching the Image Dimensions to the Pattern Periods Adds Noise

A two dimensional discrete sinusoidal transform finds the spectrum of an image by assuming that the image replicates itself in all directions to infinity, as if the original image were a rectangular tile and identical tiles were laid out on a plane stretching to infinity. The transform then fits two dimensional sinusoids to the whole plane of tiles so that the sum of all of the sinusoids in the discrete spectrum produced by the transform is equal to the whole plane of tiles.

If the x and y dimensions of the original device image are integral multiples of the respective periods of the repeating pattern in the x and y directions, then the sinusoids found by the transform will also be those of the repeating pattern, as it is not possible to determine where one replication of the original device image ends and the next begins. The spectrum produced by the discrete transform shows the harmonics of the repeating pattern perfectly, and no noise has been introduced.

However if they are not integral multiples, then it is easy to see the borders of the replications of the original device image, and thus the spectrum of the whole plane (which is what is found by a discrete transform) will contain one set of harmonics for the repeating pattern and another for the laying of the device image replications next to one another. The two sets of harmonics will not coincide and, worse still, will interact in a much more complicated way than merely being added together in the spectrum. The net effect on the spectrum produced by the discrete transform is that the harmonics of the repeating pattern will be blurred or spread out across the spectrum, which necessarily reduces the SNR of the device. This may be viewed either as a lowering of the signal level because more frequencies must be zeroed out to eliminate the repeating pattern rp(x,y) from the spectrum, further reducing the information about the defects d(x,y), or it may be viewed as the addition of noise due to the harmonics caused by image replication.

Consider a sub-image formed by taking a rectangle out of the original 480×480 device image, and let W=the number of pixels in the x direction in the sub-image (width), H=the number of pixels in the y direction in the sub-image (height).

To avoid the decreased SNR due to not matching the period of the repeating pattern to the dimensions of the image that is transformed, one must clearly transform a W×H sub-image of the original device image where W and H are integral multiples of the x and y direction periods of the repeating pattern, respectively. Since the transform method will be required to analyze device images with differing periodicities of repeating pattern this in turn requires a transform technique capable of finding the spectrum of W×H sub-images for a wide range of W and H.

These Two Sources of Noise Can be Avoided by Using Recently Developed Transform Algorithms Transform algorithms now exist for finding the discrete spectra of images of most dimensions, at speeds comparable to the powers of two transforms and with no extra memory requirements. These transforms are as fast as the powers of two transforms if the dimensions of the image are powers of two, and their speed (normalized by dividing by the number of pixels in the image) decreases as the size of the prime factors of the dimensions increases. If the image dimensions are both prime numbers then the speed of the transform is no better than the straightforward transform computation (that is, it is no longer a "fast" transform).

This digital implementation of the transform method contains a transform that can transform any W×H sub-image where all of the prime factors in W or H are less than 100 (this figure could be raised further by increasing the size of arrays for intermediate computations, but the transforms are significantly slower for prime factors this large).

Finally, the type of discrete sinusoidal transform used in this implementation of the transform method is the canonical transform. The canonical transform is used instead of the Fourier transform because it has recently been mathematically proven that the canonical transform is strictly faster to compute than any other type of discrete sinusoidal transform; and it has some theoretical advantages such as not using imaginary numbers or negative frequencies, while possessing at least the level of notational convenience of the Fourier transform.

Summary of Steps in the Discrete Implementation of the Transform Method

To analyze a 480×480 pixel device image containing a repeating array for defects using the most accurate form of the transform method of the present invention:

1. $T_X$ and $T_Y$, the periods of the repeating pattern in the x and y directions, are estimated by taking line or strip transforms in the x and y directions and observing the frequencies of the major components (harmonics).

2. The input image undergoes period matching. In period matching a W×H sub-image is selected where W and H are integral multiples of $T_X$ and $T_Y$ respectively;

W and H are each as large as possible, but not more than 480; and

W and H both have a prime factorization that allows the spectrum of the W×H sub-image to be quickly computed.

3. The W×H sub-image is transformed to give its discrete spectrum.

4. The spectrum is trimmed by
   a. computing the two dimensional amplitude spectrum;
   b. finding the x and y direction lines of local amplitude maxima—the harmonics; and
   c. settling the spectrum components at the frequencies of the harmonics to zero.

5. The spectrum components at very low frequencies are set to zero (a high pass filter) to remove the dc level and gradual fluctuations due to lighting or reflectivity variations etc. Spectrum reshaping, such as filtering matched to the optics and camera, has been tried at this point and found to improve defect detectability.

6. The spectrum is inverse transformed to give the processed image.

7. A histogram of the processed image is made. Such histograms approximately follow a double-sided truncated exponential distribution, so exponential curves are fit to it and measures of the width of the distribution on both sides are obtained. These two widths are multiplied by two insensitivity factors ("controls") to obtain a low and a high threshold about the mean for the black and white defects respectively.

8. The processed image is thresholded and any parts above the high threshold or below the low threshold are declared to be defects and their location, size etc. are noted.

While the above described method produces the most accurate result, in many applications the period matching and adjustable-size portions of the method in steps 1 and 2 can be eliminated without much loss of accuracy. In practice it was discovered that when the image being inspected included a good number of periods in both directions (on the order of 10 or more), then the inclusion of the period matching steps were found to improve the sensitivity of the method only marginally. A byproduct of omitting the period matching steps is that the pixels used on the image of the device are larger and thus the processing of the information becomes much faster. Another byproduct of not using period matching is that a fixed size transform (256×256, for example, is very convenient since CCD cameras give images that are in powers of 2) can be used.

Experimental Results

To test the feasibility of the digital implementation of the transform method of the present invention, some images of a single layer engineering device were prepared. The locations of the programmed defects were known. There were twelve sorts of defects (white spots, horizontal protrusions, etc.) and they ranged in size from 1.3 $\mu$m down to less than 0.1 $\mu$m. All of the defects were imaged at 10×, 20×, 40×, 64× and 100×, and under BFLD (brightfield) light and B100 light. BFLD lighting is the lighting normally used for imaging, comes from a large aperture, and provides partially coherent light (coherence ratio=0.7). B110 lighting is the lighting normally used for linewidth measurements, comes from a small aperture, and provides more coherent light (coherence ratio=0.3). Tests were run to attempt to find all of the defects under all of these conditions.

The results were:

All of the programmed defects were detected under the 40×, 64× and 100× magnifications and both lighting conditions. The lower the settings of the insensitivity controls the smaller the defects detected. It was relatively easy to detect 0.1 $\mu$m defects on the 40× images (0.5 $\mu$m pixel size). At the level of detection that detects 0.1 $\mu$m defects many circuit irregularities are legitimately classified as genuine defects.

At 20× (1.0 $\mu$m pixel size) and 10× (2.0 $\mu$m pixel size) magnification with BFLD light the programmed defects larger than about 0.32 $\mu$m and 0.65 $\mu$m, respectively, could be detected without incurring defects that were thought to be possible nuisance defects. Turning the insensitivity control lower resulted in smaller programmed defects being detected, but other "defects" were possibly nuisance defects. For example, while the insensitivity could be set so that all of the defects down to 0.35 $\mu$m in the 10× image could be detected it was not clear how many (if any) of the other "defects" were nuisance defects.

Some of the programmed defects that were detected by the transform method at 40× were not detectable by the prior random pattern inspection systems in its highest magnification mode (200×).

Detection ability was marginally better for BFLD lighting than for B100 lighting, for all magnifications. At 10× and 20× using B100 instead of BFLD reduced the pixel to defect ratio of the defects conservatively detected from about 3:1 to about 2.5:1.

Further features of the transform method of the present invention:

The method requires just one device image (no comparison image).

The method preserves the shading, size and shape of the defect. In the processed image the size and shape of the defect is quite clearly visible if the defect is larger than a couple of pixels. If the defect is due to extra white material or missing black material it shows up as white in the processed image, and if the defect is due to extra black material or missing white material it shows up as black.

Other findings include:

If a device image at 40×, 64× or 100× is transformed, low-pass filtered, and inverse transformed it was found that if the low-pass filter eliminated all spectral components at frequencies a little higher than the first harmonic then the human eye could scarcely distinguish the original and processed image. On a 100× image the first harmonic typically is at about 0.10 or less of the Nyquist frequency of the spectrum (x or y direction), and at 40× it is typically 0.20 or less.

There appears to be little repeating-array energy beyond the first five harmonics or so, but there appears to be significant defect energy at these higher frequencies.

It was discovered that any low-pass filter reduced the sensitivity of the transform method of the present invention for small defects.

A method based on one dimensional (line) transforms instead of a two dimensional transform has also been shown to be able to detect defects. The hybrid and transform method work in the same way with one dimensional transforms—just transform an image by applying one dimensional transforms to each row in the image, instead of applying a two dimensional transform to the image. However, the sensitivity using one dimensional transforms is usually significantly less that the method based on two dimensional transforms—how much less has to be determined on a case by case basis.

Comments

If there is a repeating spatial pattern the frequency spectrum is going to have very strong spectral lines at frequencies corresponding to the period of a repeating cell. Thus, there will be a very strong first harmonic, second harmonic, third harmonic, etc. The first harmonic corresponds to something that repeats every cell width, the second harmonic corresponds to something that repeats twice per cell width, and so on. All of the information that repeats is going to form just a few frequency bands. So the idea is to take a transform and find the spectrum of an image, remove the frequency bands corresponding to the repeating bits, inverse transform back into the spatial domain, and what is left is a picture of anything that does not repeat—it includes random patterns, noise and defects.

FIG. 1 is a block diagram that illustrates the basic inspection system of the present invention. FOV1 and FOV2 (FOV is "Field Of View") are two images that, in the absence of defects, should be the same except for some minor misalignment. One image might be from an actual device while the other might be from a description (e.g. precision drawing) of what the device should be, or both images might be two different corresponding views from the same device or two devices that should be identical.

The images that are to be compared are labelled FOV1 (2) and FOV2 (4). Each FOV is a pixel map of the image that for convenience has been selected to be 256×256 pixels, though the present invention is applicable to rectangular images of any size or aspect ratio. Each pixel in the two FOV maps is also selected to have a particular gray value. For convenience the gray value of each pixel is selected to be represented by an 8 bit word that yields a gray scale value of 0–255. Additionally, each FOV can be thought of as a superposition of three elements: the pattern on the device, noise and defects.

Looking first at how FOV1 (2) is processed, its spectrum is determined by taking a transform (6) of it. The transform may be any Fourier-like two dimensional transform, and in this example the canonical transform is used since it is the fastest and most convenient. Details of Canonical transforms can be found in *An Improved Approach to Harmonic Spectral Analysis, and the Canonical Transform* by David Evans, December 1989, Stanford University PhD Thesis in Electrical Engineering.

Figure 2:
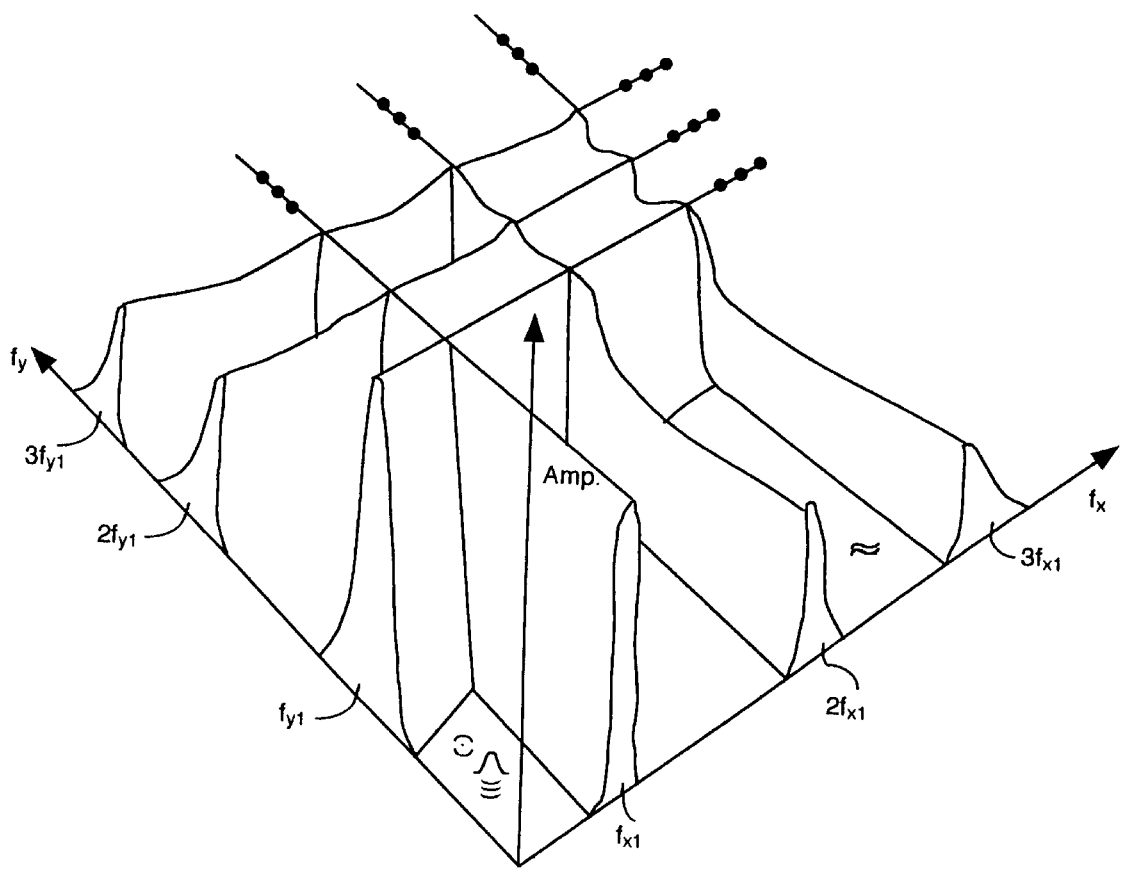
FIG. 2 is a frequency domain plot of the transform of a device having a substantial repeating pattern and some random pattern, defects or noise.

FIG. 2 illustrates the frequency domain representation of a device following the taking of the transform. The device of interest here is one with a repeating pattern, no random pattern, and some defects or noise. By inspecting the frequency domain plot it can be observed that there are areas where there is not much information as well as areas where there are well defined, steep-sloped, tall ridges. Those ridges are the harmonics that correspond to the repeating features in FOV1. The other features, the random pattern, defects and noise, transform into the small blips that typically appear in those areas where the ridges do not occur, as illustrated in FIG. 2 in the region below frequencies $f_{x1}$ and $f_{y1}$.

The low frequency variations in FIG. 2 could also be caused by a possible curve to the surface of the device. If the curve is only slowly varying then it will be at a low frequency, however, if it is quickly varying it will be attributable to the pattern on the device itself.

At step (8) (FIG. 1) those harmonics are removed by zeroing them out. In the memory containing the data values of the transform, the data points that correspond to the ridges are replaced with zero values. Then, what ever filtering that might be desirable to perform in the frequency domain is done (9). For example, remove high frequency values, remove noise, invert the transform effects introduced at low frequencies, and so on. Additionally, this method allows for the compensation of the MTF of the optics—which the In-Systems method is incapable of doing, since it is only practical to compensate for MTFs by digital means.

Next, the modified spectrum is inverse transformed (10) back into the spatial domain. At this stage the repeating array pattern has been removed, leaving only the random pattern, noise and defects. A threshold is then selected (12) between the noise and the defects to remove the noise component that remains which leaves the large defects for analysis (14).

The inspection path of FOV2 (4) is the same as the inspection path of FOV1 (2) with the exception of a shifting filter 22, that will be discussed below, following the harmonics removal (8'). The same operations are performed on FOV2 with each of the like blocks having been numbered the same as the blocks for FOV1 with a prime symbol added.

The third column in FIG. 1 is for alignment and comparison of the FOV1 and FOV2. Often the physical machinery has already aligned the FOV1 and FOV2 to within a few pixels, typically 5 pixels. To make a comparison between the two FOVs one must be subtracted from the other. Hence, before subtraction, FOV2 must be shifted so that it is aligned with FOV1. The more misalignment that remains, the more noise that will be introduced by the subtraction process and thus the more the sensitivity of the technique will be reduced.

There are two parts to the alignment process: finding the relative offsets $\Delta x$ and $\Delta y$ (the required amounts by which FOV2 must be shifted in order to align it with FOV1), and shifting FOV2.

To determine $\Delta x$ and $\Delta y$, in the present invention uses the correlation theorem of transforms. This says that the transform of the correlation surface of two images is equal to the product of the transform of one image (6) with the conjugation of the transform of the other image (16) (this is true exactly as stated for either the Fourier or canonical transforms, using complex and shiftor arithmetic respectively). Further, the correlation surface is a function of the offsets between the images—its value is the linear correlation between the two images. In FIG. 1 the conjugate of the transform of FOV2 is multiplied by the transform of FOV1 (18) with the result undergoing an inverse transformation (10") which yields the correlation surface. The peaks of the correlation surface, which are located at $\Delta x$ and $\Delta y$, are then detected (20) by only looking within a few pixels of the origin of the surface since the mechanics of obtaining the FOVs already ensure that they are aligned to within a few pixels. This method for finding $\Delta x$ and $\Delta y$ is the most accurate method possible, by definition, and is therefore very reliable. There are some spatial domain methods that can come close to giving similar performance to this method, but they are not as reliable, they are not quite as accurate and given that the transforms of FOV1 and FOV2 are available, they are generally not as economical or as fast.

To align the FOVs electronically means that it is necessary to use a technique for interpolating between the two sets of grid points of the two FOVs since the shift required to align the FOVs usually contains fractions of pixels. For example, actual alignment might require that FOV2 be moved $\Delta x=2.34$ pixels in the x direction and $\Delta y=-1.79$ pixels in the y direction. Typical electronic alignment shifts are performed in the spatial domain, and all of them introduce significant interpolation errors—which must be regarded as noise in the resultant shifted FOV2. For example, the cubic interpolator uses a 4×4 array of pixels in the unshifted FOV to determine each pixel in the shifted FOV—the 4×4 array consists of the weights that are put on the surrounding 4×4 pixels when forming the interpolation average—so a mere 16 pixels in the unshifted image are taken into account to produce each pixel in the shifted image.

The method illustrated in the top portion of the third column of FIG. 1 shifts FOV2 in the frequency domain, unlike the prior art which performs the shifting in the spatial domain. The result of the frequency domain shift is that it is a perfect shift without the introduction of any noise which would have been introduced in a spatial domain shift. Thus, in the method of the present invention shifting filter 22 alters the offsets, relative to the origin on the x-y plane, of each two dimensional sinusoid in the spectrum of FOV2 (i.e. it alters the two dimensional 'phases'). For each two dimensional sinusoid in the spectrum of FOV2, the precise offsets are easily calculated from $\Delta x$ and $\Delta y$ using trigonometry, and then applied. In effect, all of the pixels in the unshifted image are taken into account to produce each pixel in the shifted image.

The total alignment process of determining and applying the required offsets is thus most efficiently, reliably and accurately applied in the frequency domain and introduces only a very small amount of noise relative to perform the same offset corrections in the spatial domain (there is some noise when working in the frequency domain because even the best $\Delta x$ and $\Delta y$ may not be perfect). As a matter of economy, since the two images have already been transformed into the frequency domain to apply the transform method of the present invention to them, it is relatively cheap in time and equipment to also apply frequency domain alignment techniques to them. Thus, this is an inherent advantage of the hybrid technique of the present invention.

The two fields of view are processed simultaneously from corresponding sites or corresponding die, etc. The same transform is applied to both FOVs with the same linear filtering being performed on the image spectrums to remove the harmonics and other features. Then the modified spectrums are transformed back into the spatial domain (10, 10') where the resultant modified spatial images can be subtracted (24), one from the other.

The processed images from the FOVs and the difference image formed at 24 are each then thresholded in order to separate the noise from any defects that might be present. In thresholding an image the maximum absolute value of grey level at each pixel due to noise alone is estimated, and the pixels with absolute grey levels above that threshold are declared to be candidate defect sites. The thresholding in the three images performed at 12, 12' and 12", could possibly use different threshold levels. In steps 12 and 12' the shadowing effect that resulted from the trimming of the spectra of FOV1 and FOV2 is also taken into account. When the spectrum of an image is trimmed some sinusoids that contribute to a defect are also removed. Consequently, when the spectrum is inverse transformed back into the spatial domain any defect will also be exhibited at locations that are integral numbers of cell lengths from the actual location. That is, these shadows of the defect will be found above and below, to the left and to the right, of the actual location in the original FOV signal, at distances corresponding to integral multiples of the size of the repeating pattern in the original image. Further, the shadows are always of the opposite color of the defect—a white defect has black shadows and a black defect has white shadows. Additionally, the shadows are always less strong than the actual defect. All of these features thus make the shadows easy to identify and remove from the defect map—all defects that are an integral number of cell widths or heights from a stronger defect of an opposite color are thus ignored.

The real defects are then found by one of two methods. If there are a huge number of defect candidates in the processed images (more than could reasonably be expected to actually exist in the two images), then the processed images are ignored and all of the candidate defects in the difference image (14") are considered to be defects (this will be the case if the original images include some random pattern). If the number of candidate defects in the processed images is not huge (i.e. the number of candidate defects are reasonable for an image), then those candidate defects are considered to be defects and the difference image is ignored (this will be the case if the original images include only repeating patterns). The selection of which candidate defects to declare as real defects are made in step 28 and presents the list at 30.

The transform method of the present invention effectively takes an average of every cell in the whole image by taking many, many cells into account to build a very accurate picture of what the cell should look like. Thus, it is very sensitive to defects, which are deviations from what the cell should look like. The hybrid technique of the present invention incorporates that transform method and automatically applies it to images containing repeating patterns. Hence, the hybrid technique is very sensitive to defects in the repeating areas of a device. In the random areas of a device, the hybrid technique of the present invention automatically selects the defect map obtained by comparing the two images after aligning them in an almost noiseless manner and applying various frequency domain filters. In summary, the hybrid technique of the present invention automatically applies either the transform method or an enhanced, and relatively noiseless, version of the comparison algorithm.

Figure 12A:
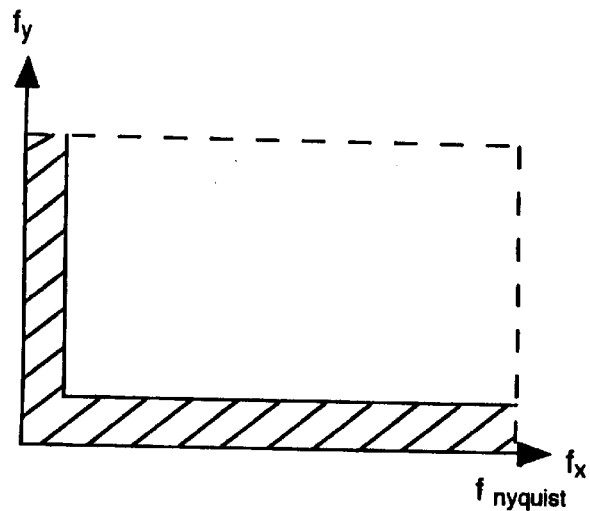
FIGS. 12a–12c illustrate three different features that might be filtered from each FOV.
Figure 12B:
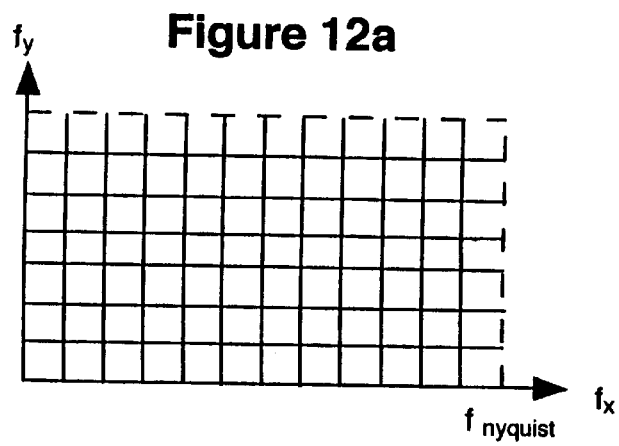
Figure 12C:
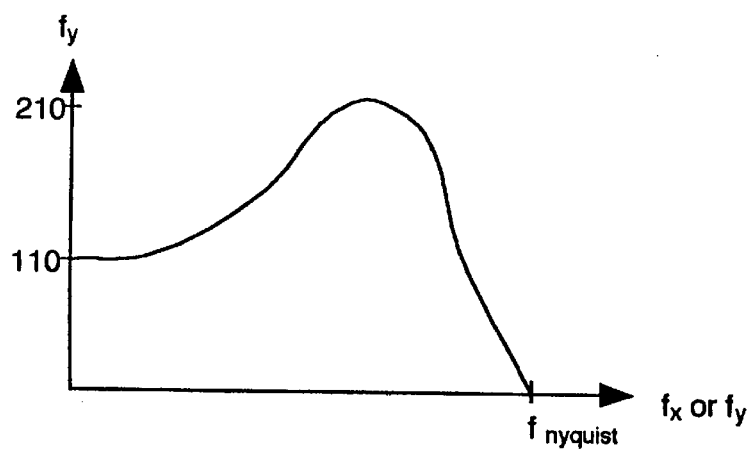

Numerous filtering approaches might be used in the optional filtering steps 9 and 9'. In FIGS. 12a–12c three possible filtering criteria are illustrated. In FIG. 12a the high-pass filtering of the image is illustrated to remove the low frequency variations in the image in both the x and y directions. FIG. 12b illustrates the filtering of the harmonic signals in both the x and y directions. Finally, FIG. 12c illustrates typical MTF compensation filtering in the x and y directions.

Figure 11A:
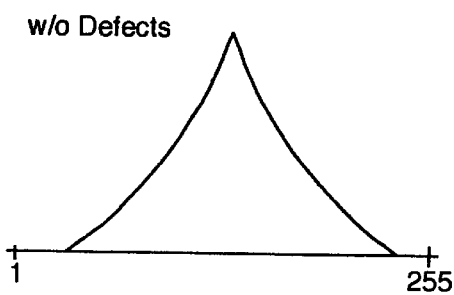
FIGS. 11a–11d illustrate one approach to the thresholding steps of the flow of FIG. 1.
Figure 11C:
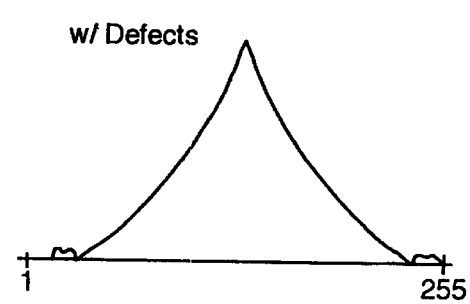
Figure 11B:
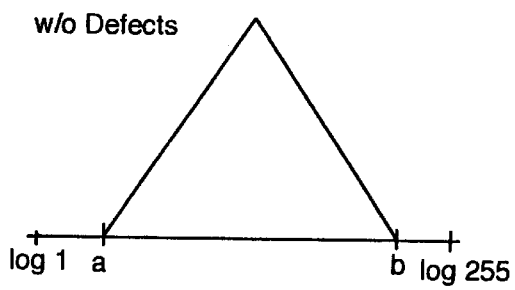
Figure 11D:
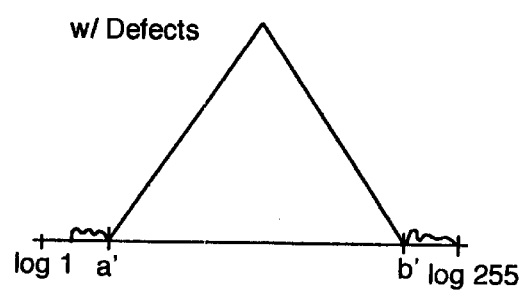

Blocks 12, 12' and 12" of FIG. 1 each specify the thresholding of the signals in the various paths which can be performed by any of a number of a wide range of numerical shortcuts or approximations. FIGS. 11a–11d illustrate the use of logarithms to perform that function. In FIG. 11a there is shown a double-sided truncated exponential noise distribution without any defects, and which is shown wider than one would usually encounter for illustration purposes (usually this curve would only be about 10 levels wide). When the log of the function of FIG. 11a is taken the resultant log plot is shown in FIG. 11b, and as per this approach "a" is selected as the lower threshold and "b" is selected as the upper threshold. FIG. 11c illustrates a plot that contains defects which is similar to that of FIG. 11a, and FIG. 11d shows the log plot of the function of FIG. 11c. In FIG. 11d the log plot of FIG. 11c is shown with the black defects shown at the left end of the is response below the log of "a" and the white defects shown to the right of the log of "b".

Figure 10:
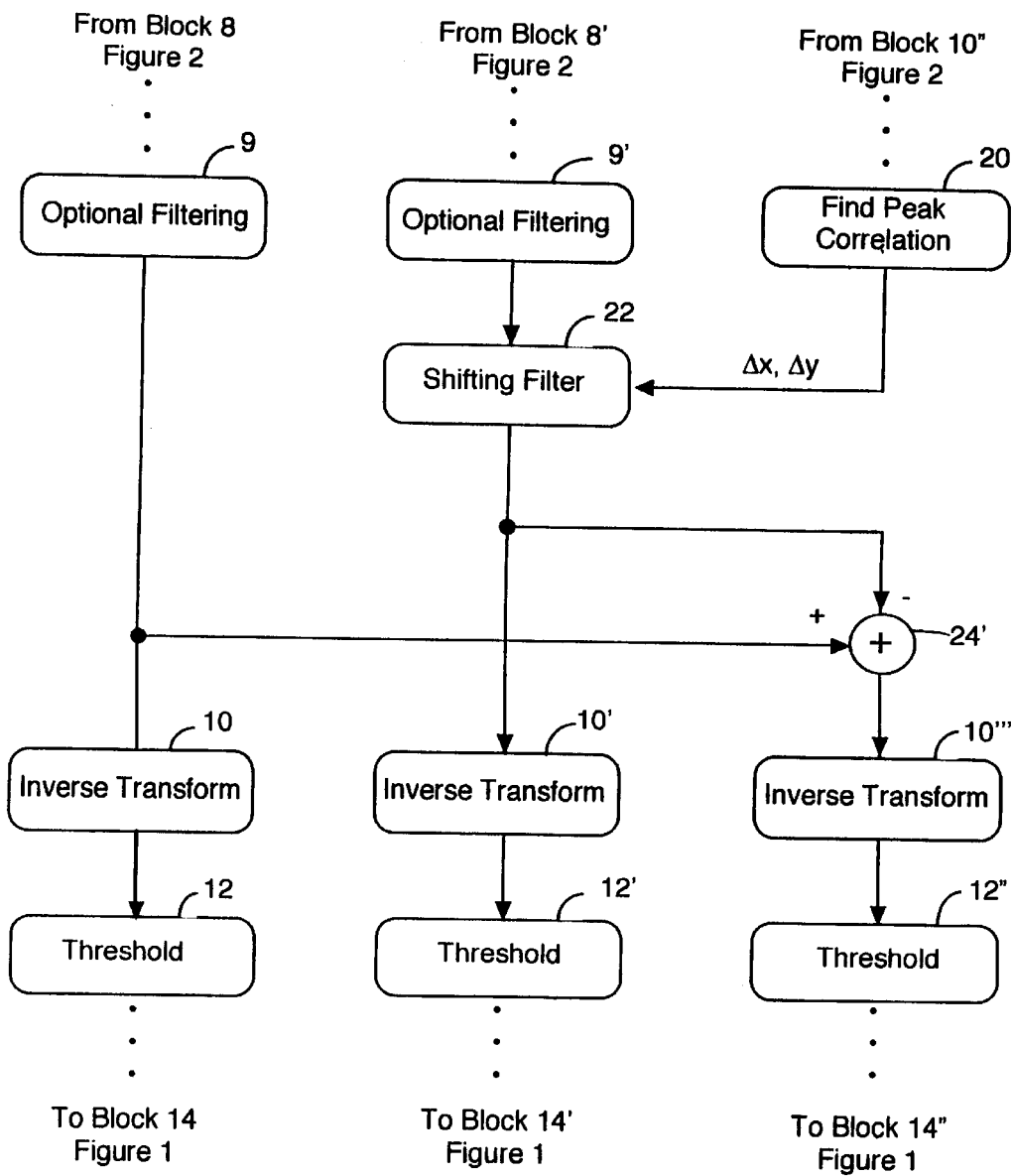
FIG. 10 is a partial flow chart that illustrates the changes necessary to the central portion of the flow chart of FIG. 1 to perform the image subtraction function in the frequency domain instead of the spatial domain as illustrated in FIG. 1.

In FIG. 1 image subtraction to form the difference image is done in the spatial domain since it occurs after the inverse transform steps 10 and 10' in the first and second columns. This approach was selected since it requires less hardware to achieve that result. It could just as well be performed in the signals for each FOV in the frequency domain before the inverse transformations are made. FIG. 10 illustrates how this could be done by showing the central region of the flow chart of FIG. 1 such that the filtered FOV1 and FOV2 are subtracted one from the other immediately before the inverse transformations are performed. By performing this function in the frequency domain there is an additional inverse transform step 10'" that is required in the third column which was not required in the implementation of FIG. 1.

As described above, thresholdings are performed for three images at 12, 12' and 12" to separate the noise from any defects that might be present. An object of this invention is to provide an automatic thresholding scheme that generates a variable threshold on the fly to optimize the defect detection. Defect detection relies on the fact that defective pixels have higher gray levels that the normal residual or noise gray levels. The processed residual images from the FOVs and the difference image typically have a histogram that follows an exponential distribution if there is no defect. The defect, if it exists, must have gray levels outside the normal exponential distribution. The histogram can be regarded as a probability distribution on the image pixel gray levels. I the distribution can be estimated, a threshold can be chosen to satisfy a certain pre-defined probability for which the detected defective pixel may be noise or normal residual patterns. In general, the threshold level is selected so that defects detected have a small likelihood of being noise or normal residual patterns.

In order to determine the exponential distribution for the histogram, an exponential function Aexp(−Cw) can be fitted to the histogram H(w), w=0, 1, 2, . . . . , 255, using techniques such as least squares estimation, where A and C are two constants governing the distribution. To simplify the estimation, the logarithms of H(w) can be taken to fit a straight line, i.e.

$$\log (H(w)) = \log A - Cw$$

for w=0, 1, 2, . . . 255

Constants A and C can easily be estimated from the above equation based on estimation theory. In Practice, if defects exist in the residual image, the gray levels of defective pixels disturb the normal histogram distribution and appear at the tail of the histogram. When the desired exponential distribution is to be estimated, the tail of the histogram is examined and the abnormal part should be ignored to maintain the smoothness of the histogram. After the distribution has been estimated, the desired threshold can be selected using pre-defined criteria. A convenient criterion of setting the threshold is to choose a threshold amplitude, $w_t$, that satisfies log (H($w_t$))=0. Dependent on the requirements of the user, the selected threshold amplitude can be adjusted to offer more sensitive or less sensitive inspection.

Implementation

Figure 3:
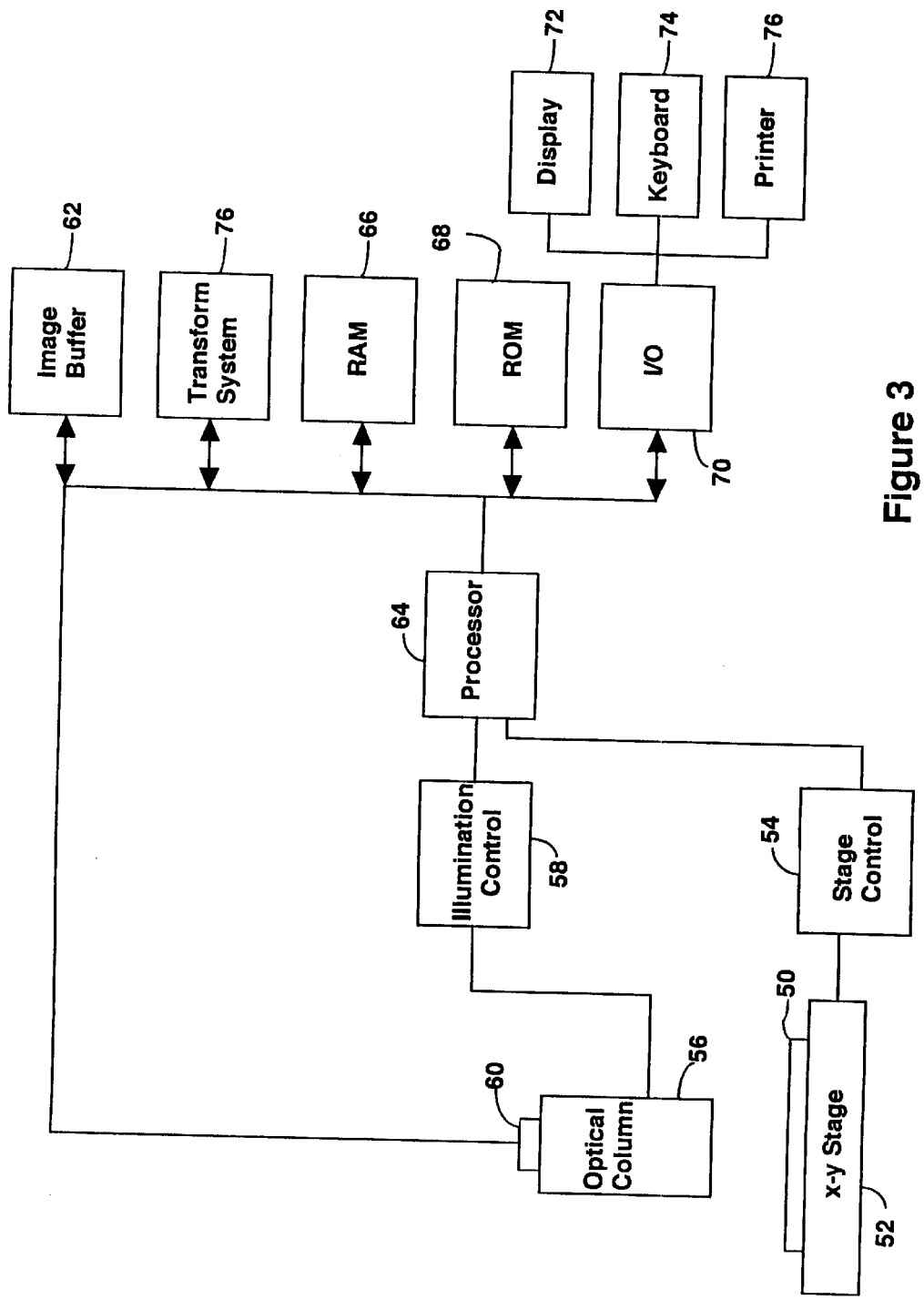
FIG. 3 is an overall block diagram of an inspection system equipped to perform defect analysis by the transform method of the present invention.

FIG. 3 illustrates a general inspection system which includes the transform method of the present invention. An optical inspection system for inspecting a device 50 is typically built around a central processor 64 which controls and integrates the operation of each of the component systems of the overall inspection system. One of those components is an x-y stage 52 on which device 50 is mounted to be moved by stage control 54 beneath optical column 56 to illuminate and image the entire surface of interest. This is necessary since most devices are larger than the area that the optical system can capture at any point in time.

Optical column 56 is in turn controlled by illuminator control 58 with detector 60 converting the optical image of device 50 into pixel signals, each pixel of a selected grey scale value. In the discussion of the present invention it is presumed that each pixel is encoded in 8 bits to provide a grey scale range of 0–255, however, the present invention is not limited to pixels of eight bits, fewer or more bits could also be used with the system of the present invention. The pixel data from detector 60 is then stored temporarily in an image buffer 62 before all, or portions, of that image are transferred to the transform system 76 or to RAM 66 for longer term storage.

The inspection system of FIG. 3 also includes the usual support elements for processor 64, namely RAM 66, ROM 68 and I/O 70 which interact with processor 64 and each other via a data bus. Also communicating via the data bus, as necessary, are image buffer 62 and transform system 76.

For reasons of symmetry it was decided for the experimental transform system that square images would be processed. Additionally it was noted that the computation of the necessary transforms in hardware was considerably easier if the dimensions of the image to be processed was a power of two in each direction. Further, a smaller dimension was also preferred because it requires less transform calculation per pixel, and because it gives more flexibility in efficiently dividing the images of the full images of the most popular inspection systems now on the market into sub-images for processing with the transform method of the present invention. In order to be able to keep the processing time for the transform method of the present invention within a reasonable length of time, the portion of the image of device 50 that can efficiently be handled by the transform method of the present invention, given the present technology, may be smaller than the image area that can be handled by other inspection techniques.

Figure 4:
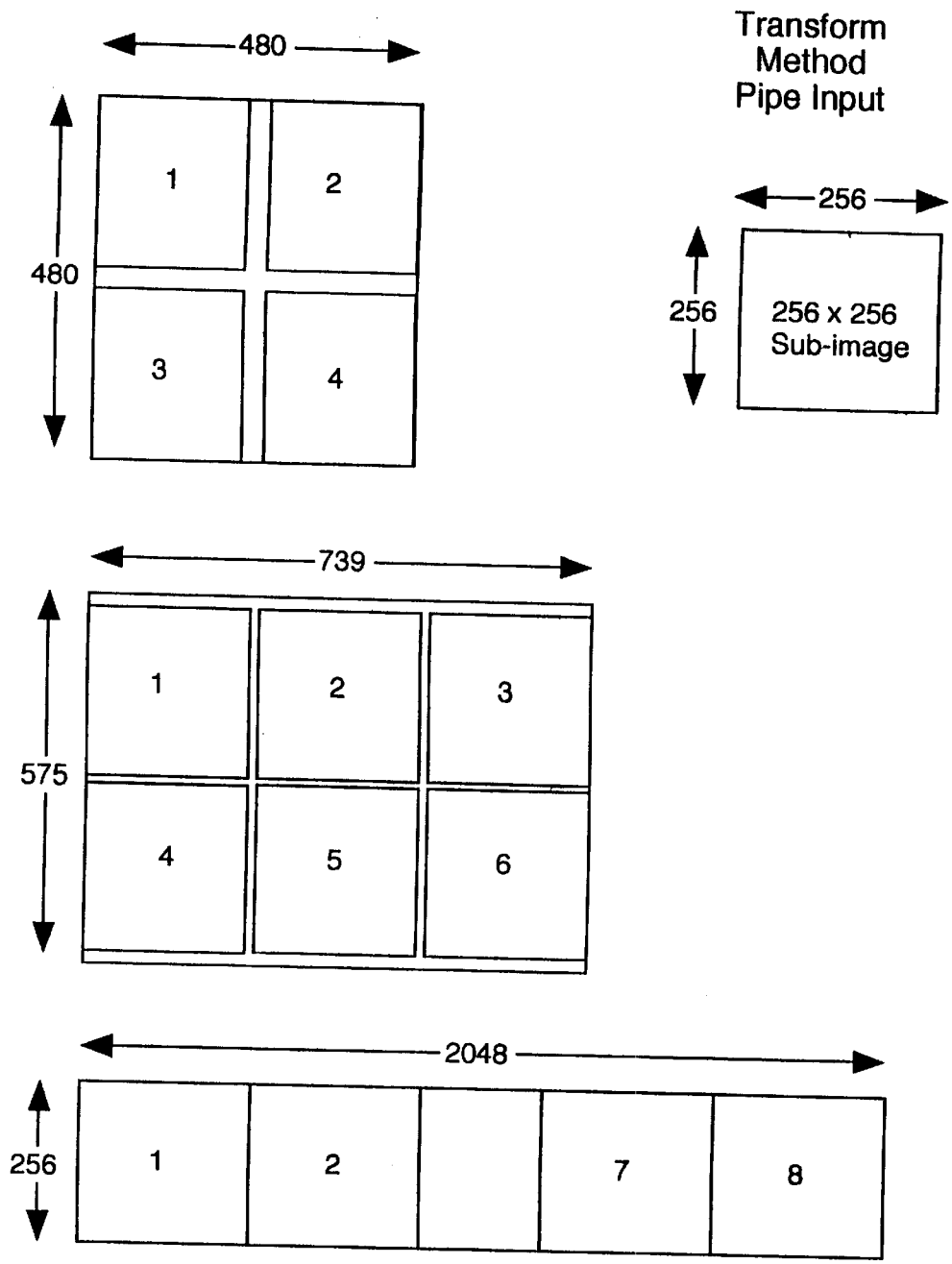
FIG. 4 illustrates the sub-division of images captured by the optical systems of prior art inspection devices to create a sub-image for processing by the transform method of the present invention, assuming that the input images for the hybrid technique are 256×256.

In FIG. 4 three of the most popular inspection image sizes are illustrated, namely 480×480 pixels, 575×739 pixels and 256×2048 pixels. Assuming that the image size to be used with the present invention is 256×256 pixels, each of the popular image sizes are shown divided into sub-images for use with the transform method of the present invention. For example, in the 480×480 the resulting division results in four sub-images with some overlap in both the x and the y directions, in the 575×739 the resulting division results in six sub-images with some overlap in the x direction and not full coverage in the y direction, and finally in the 256×2048 the resulting division results in eight sub-images which have no overlap in either direction and which cover the entire original image size. Therefore in the experimental implementation of the present invention it was decided to divide the original images from the various inspection systems into sub-images of 256×256 pixels and to apply the transform method independently to each sub-image.

The transform method of the present invention processes each sub-image independently, which as well as eliminating alignment noise in the algorithm, also simplifies the image acquisition and allows for a high degree of parallel processing. Thus, not only can corresponding sub-images from two different fields-of-view be processed at the same time (see FIG. 1), it is also possible, given enough hardware, to simultaneously and independently process more than one sub-image from the same field-of-view at the same time. That is sub-images 1-4, or 1-6, or 1-8 (see FIG. 4) could all be processed simultaneously since the processing of one sub-image does not depend on information determined in the processing of any other sub-image.

Figure 5:
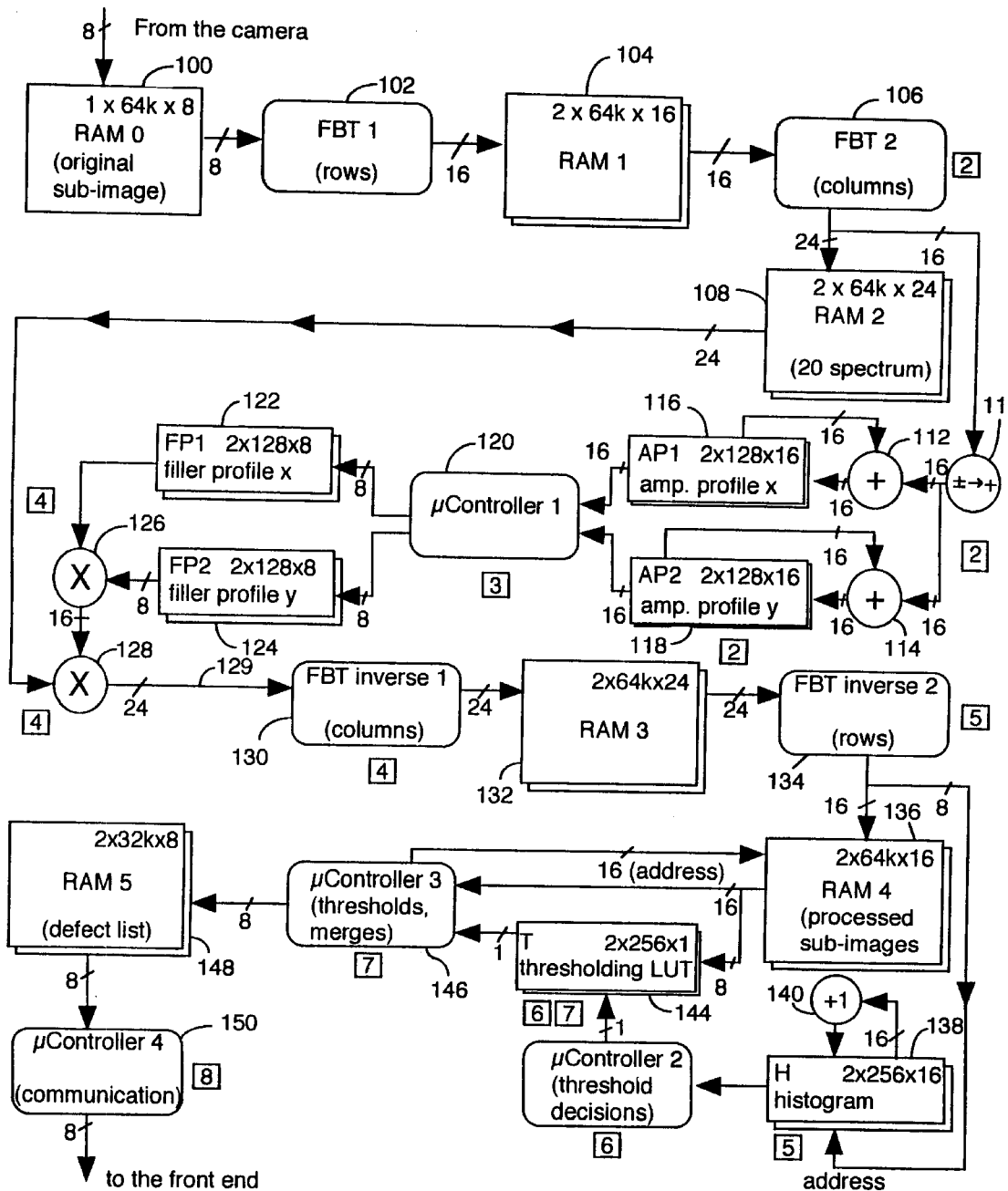
FIG. 5 is a block diagram of an implementation of the transform method (on only one image at a time) of the present invention.

FIG. 5 illustrates, in pipe-line form, the implementation of the left column in the flow chart of FIG. 1 for the first field-of-view. A substantially similar pipe-line is also necessary for processing the sub-image from the second field-of-view and a modified pipe-line with inputs from the pipe-lines for the first and second fields-of-view is also necessary for each inspection.

Figure 6:
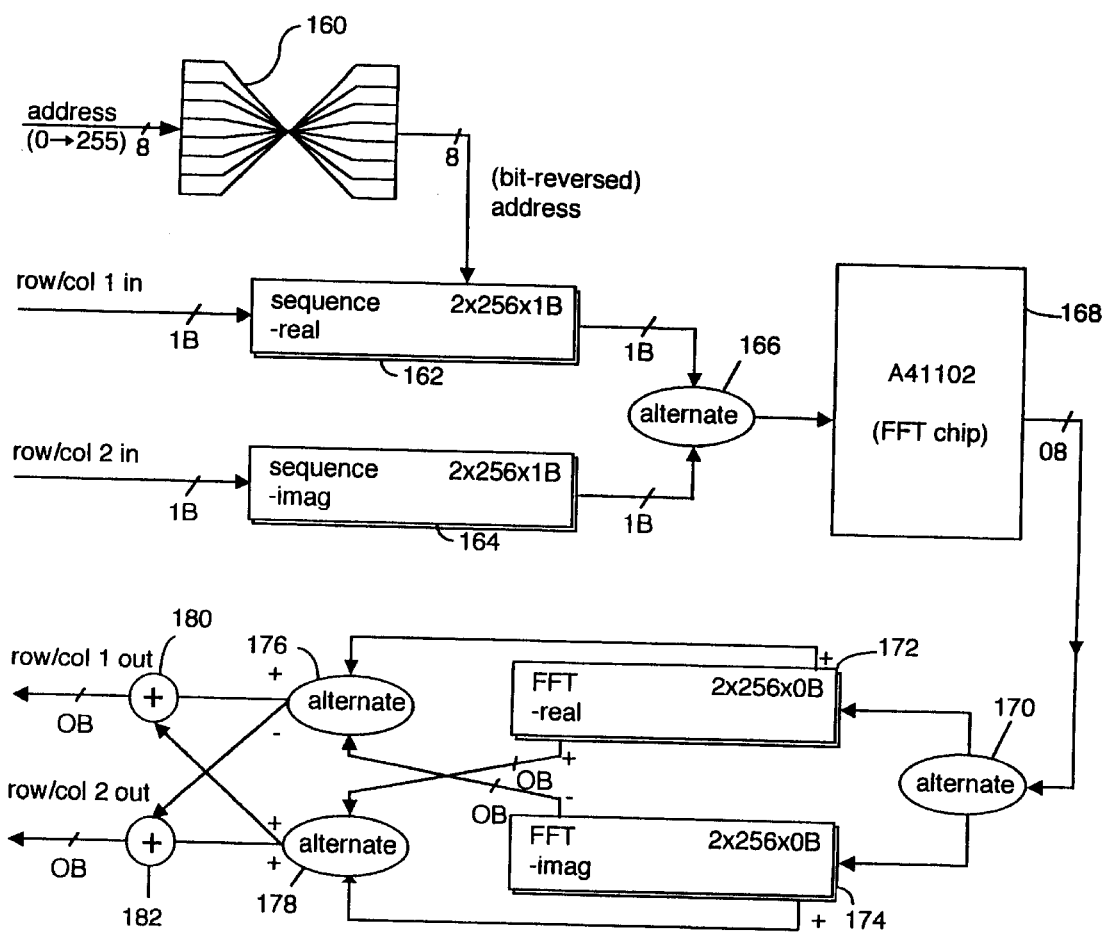
FIG. 6 is a block diagram that illustrates the canonical transform blocks of FIG. 5 in greater detail.

To simplify the illustration of the pipe-line of FIG. 6 only a single line is shown interconnecting each of the blocks of the diagram with a "/" and an associated number to indicate the number of bits transferred on each line or set of lines. Thus the number associated with each line indicates the number of bits and the number of interconnecting lines between the corresponding blocks.

For convenience of discussion, each pipe-line is divided into several stages as indicated in FIG. 5 (stage numbers in squares). Each sub-image is thus processed by each stage in turn until a defect list is output from the final stage. Additionally, each stage has been implemented to take the same amount of time to execute. The image processing operations performed in each sub-image and the stages over which each operation is accomplished are:

Operation
Stages
1. Transform sub-image to 2-dimensional spectrum 1,2
2. Trim harmonics from 2-dimension spectrum 2,3,4
3. Filter the 2-dimensional spectrum 3,4
4. Inverse transform filtered 2-dimension spectrum for 256×256 sub-image of noise and defects 4,5
5. Determine noise/defects threshold w/ histogram 5,6
6. Threshold the noise/defects sub-image 7
7. Report the defects 8

Stage 1

Initially the pixel information of the sub-image to be processed from detector 60 is input into RAM 0 (100) (image buffer 62, FIG. 3) from which the pixel information is applied to FBT1 (102) (fast canonical transform) where the rows of the sub-image are transformed. In order to simplify FIG. 5 the operation of the FBT and FBTinverse blocks (102, 106, 130 and 134), since they are substantially the same as each other and somewhat complicated, the representative block diagram that represents each of them is shown in FIG. 6. It should be noted that in FIG. 6 "IB" stands for the "number of input bits" (either 8, 16 or 24 bits) and "OB" stands for the "number of output bits" (either 16 or 24 bits).

Thus, in operation FBT1 (102) with reference to FIG. 6, the inputs to registers 160–164 are obtained from RAM 0 (100) in FIG. 5. For each pair of rows of the sub-image the elements of the two rows are permuted into bit-reversed order by physically reversing the eight address lines of the row index in register 160. One of the permuted rows, row 1 for purposes of this discussion, is treated as the real input and the other permuted row, row 2, as the imaginary input which are alternately applied to the Fast Fourier transform chip (A41102) 168. In this application the input words to FFT chip 168 are 8 bit words with 16 bit words as outputs. The output of FFT chip 168 is the one-dimensional complex length-256 Fourier transform, F(v), v=0,1, . . . 255 of the rows. The real and imaginary output components from FFT 168 are alternately (170) applied to registers 172 and 174, respectfully. Then with the use of alternators 176 and 178, together with adders 180 and 182, the FFT real and imaginary components of $F(v)=F_{real}(v)+iF_{imag}(v)$ in registers 172 and 174, are converted into the two one-dimensional real length-256 canonical transforms, $B_1(v)=(B_{C1}(v),B_{S1}(v))$ and $B_2(v)=(B_{C2}(v), B_{S2}(v))$, v=0, 1, . . . 128, of rows 1 and 2 respectfully:

for $v \in \{1,2, \ldots ,127\}$:

$B_{C1}(v)=F_{real}(v)+F_{real}(256-v)$
$B_{S2}(v)=F_{real}(v)-F_{real}(256-v)$
$B_{S1}(v)=-F_{imag}(v)+F_{imag}(256-v)$
$B_{C2}(v)=F_{imag}(v)+F_{imag}(256-v)$
$B_{C1}(0)=2F_{real}(0)$
$B_{C1}(128)=2F_{real}(128)$
$B_{C2}(0)=2F_{imag}(0)$
$B_{C2}(128)=2F_{imag}(128)$
$B_{S1}(0)=B_{S1}(128)=B_{S2}(0)=B_{S2}(128)=0$ Additionally, the bit-reversed output of the FFT chip 168 is piped through two 16-bit adders 180 and 182, and rows 1 and 2 are replaced with $B_1(v)$ and $B_2(v)$, respectively, and placed in RAM 1 (104) (see FIG. 5).

Stage 2

The resulting transform of the rows stored in RAM1 (104) is applied to FBT2 (106) to transform the columns of the sub-image. The operation of FBT 2 (106) is also illustrated by reference to FIG. 6. This functions similarly to the way FBT1 (102) functions as described above with the columns of the partially converted sub-image in RAM 1 (104) instead of the rows to determine the two-dimensional canonical transform of the input image $B(v_2, v_1)=(B_{CC}(v_2,v_1), B_{CS}(v_2, v_1), B_{SC}(v_2, v_1), B_{SS}(v_2,v_1))$, $v_2=0,1, \ldots, 128$, $v_1=0,1, \ldots, 128$. Here FFT chip 168 uses 16 bits of input and 24 bits of output, and adders 180 and 182 are 24 bit adders.

Returning to FIG. 5, the canonical transform 15 of the sub-image is then stored in RAM 2 (108). The absolute value of the 16 most significant bits of the two-dimensional transform from FBT2 (106) is determined by removing the sign bit (110). The amplitude profiles, AP1 and AP2, of registers 116 and 118, respectfully, are created by adding the absolute value of the 16 most significant bits of $B(v_2,v_1)$ to both AP1 ($v_1$) and AP2 ($v_2$). This yields the profiles along the x and the y axes.

Stage 3

In this stage the horizontal and vertical lines which need to be trimmed from the two dimensional spectrum, due to (1) trimming the harmonics and (2) filtering the spectrum, are determined. The sole effect of stage 3 is to set the elements of the two 128×1 filter profile vectors FP1($v_1$) ($f_x$ direction) and FP2 ($v_2$) ($f_y$ direction), $v_2=0,1, \ldots, 128$, $v_1=0, 1, \ldots 128$, to 0, 1, or an intermediate value. The profile vectors are stored in registers 122 and 124 as they are created. This is accomplished by an algorithm in µcontroller 1 (120) that looks at the amplitude profiles, AP1 and AP2, in registers 116 and 118, to detect the peaks, that is, locates the harmonics in the $f_x$ and $f_y$ directions. Once the peaks are located, a 0 is placed in each of the FP1 locations corresponding to spectral lines detected on amplitude profile 1 (AP1) and a 1 is placed in the remaining FP1 locations. FP2 is created similarly from AP2.

Stage 4

The two dimension canonical transform of the sub-image in RAM 2 (108) is then modified by multiplying FP1 and FP2 with that spectrum with multipliers 126 and 128. Each pair of columns of the two dimensional spectrum of the sub-image is trimmed and filtered by multiplying each two dimensional canonical transform value $B(v_2,v_1)$ by FP1($v_1$) and FP2 ($v_2$).

Figure 7:
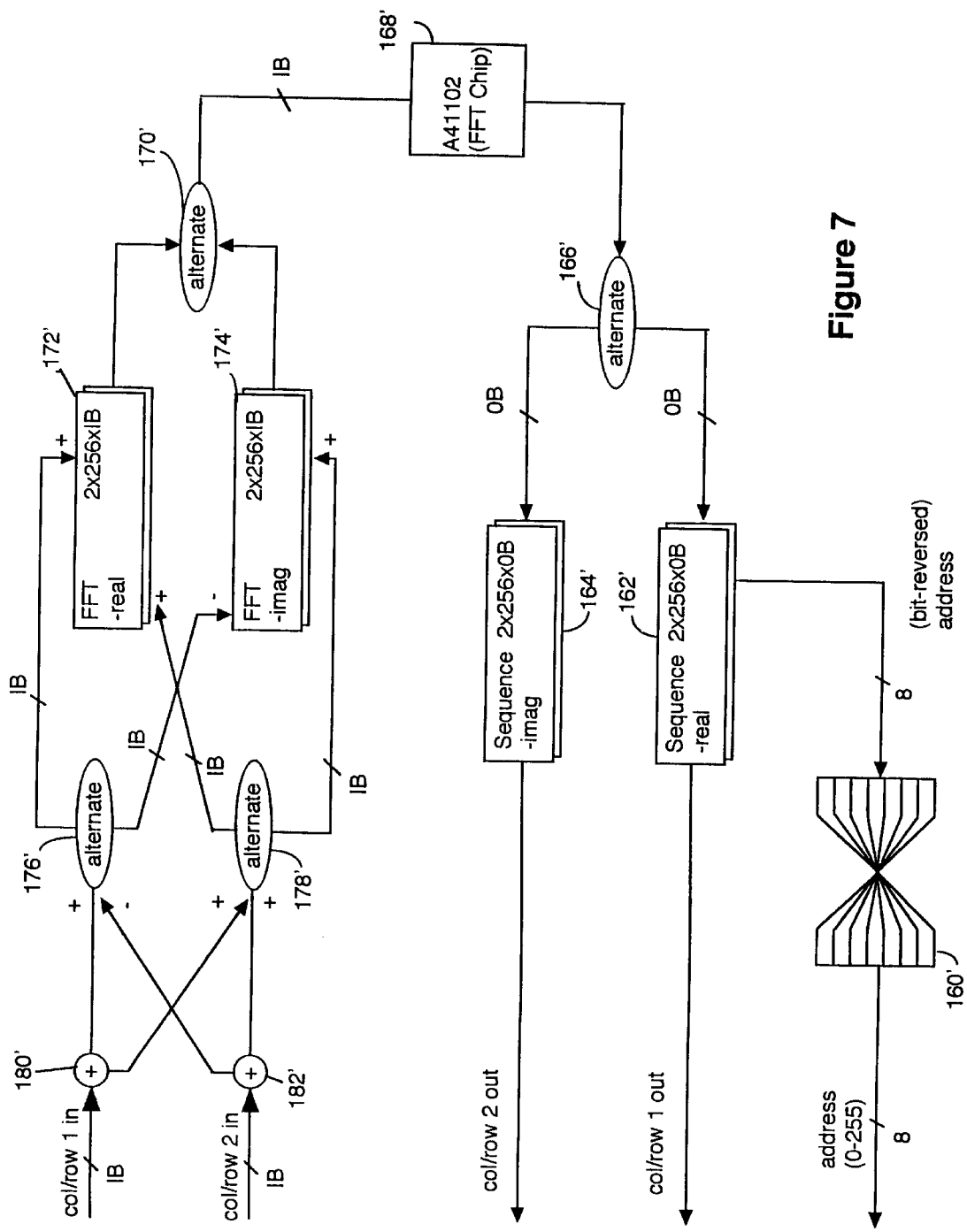
FIG. 7 is a block diagram that illustrates the inverse canonical transform blocks of FIG. 5 in greater detail.

Then the inverse transform the columns of the trimmed and filtered 256×256 canonical transform spectrum is then performed by $FBT_{inverse}$ 1 (130) which is shown in expanded form in FIG. 7 which is substantially similar to the transform block diagram of FIG. 6 basically with the data flowing in the reverse direction from that of FIG. 6. Additionally, since in the first half of the procedure the rows were dealt with first, the columns are dealt with first here. One column (col 1) is treated as the first 1 Dimensional real length-256 canonical transform $B_1(v)=(B_{C1}(v),B_{S1}(v))$, $v=0, 1, \ldots, 128$, and a second column (col 2) is treated as the second one dimensional real length-256 canonical transform $B_2(v)=(B_2(v),B_{S2}(v))$, $v=0, 1, \ldots, 128$: for $v\{1,2, \ldots ,127\}$:

$F_{real}(v)=B_{C1}(v)+B_{S2}(v)$ $F_{real}(N-v)=B_{C1}(v)-B_{S2}(v)$ $F_{imag}(v)=B_{C2}(v)-B_{S1}(v)$ $F_{imag}(N-v)=B_{C2}(v)+B_{S21l(v)}$ $F_{real}(0)=B_{C1}(0)$ $F_{real}(128)=B_{C1}(128)$ $F_{imag}(0)=B_{C2}(0)$ $F_{imag}(128)=B_{C2}(128)$ Actually this also multiplies all of the F(v) values by 2, but this is compensated for when the Fourier inverse transform is performed in A41102 in the next step. The performance of the one dimensional complex length-256 Fourier inverse transform on F(v), yields a complex output with col 1 as the real part and col 2 as the imaginary part. The third A41102 has a 24 bit input, and a 24 bit output. Next, the elements of the two columns are permuted into bit-reversed order by physically reversing the eight address lines of the index of F(v) as the columns are passed from a buffer to the 256×256 array. Finally, the original two columns of the 256×256 two dimensional canonical transform are replaced with the processed columns and stored in RAM 3 (132).

Stage 5

Here the rows of the column-inverse-transformed 256× 256 array from RAM 3 (132) are transformed in $FBT_{inverse}2$ (134) (see FIG. 7 for details) to yield the processed sub-image. The operation at this point is the same as for $FBT_{inverse}1$ (130) as discussed above with the rows being worked on here instead of the columns. Here the fast Fourier transform chip, A41102, uses 24 bits in input and 16 bits of output. This processed sub-image contains only image noise and defects and is stored in RAM 4 (136). The repeating pattern was removed by the filtering of the ridges in the transform spectrum, as discussed above. The 256×1 8-bit histogram vector, H(w), $w=0, 1, \ldots, 255$, of the processed sub-image is formed in register 138 and adder 140 using the highest eight bits of noise. This is accomplished by taking a copy of the appropriate 8 bits of each processed sub-image value as it is being stored, interpret the eight bits as w, and increment H(w) using 16 bit adder 140.

Stage 6

In this stage the lower and upper noise/defect thresholds are determined from the histogram, H(w), of the processed sub-image. This is accomplished by estimating the width of the noise distribution and setting the thresholding look-up-table, T(w) for $w=0, 1, \ldots, 255$.

If there are no defects then H(w) is the distribution of the noise. However the presence of defects obscures the noise distribution, especially at the tails of the noise distribution—which are the regions of the greatest interest. By fitting a two-sided exponential distribution to H(w) in the region of the histogram where the number of noise samples dominates the number of defects (the non-tail regions), the width of the noise distribution can be estimated. In the current implementation of the transform method, the logarithms of H(w) are calculated, straight lines are fitted to the logs of the distribution, and the width is calculated by intercepting these lines with a given probability density.

Microcontroller 2 (142) estimates the thresholds from the values of H(w) in register 138. As with microcontroller 1 (120), microcontroller 2 (142) is dedicated to this stage and runs in isolation needing only to be synchronized with the rest of the systems.

Once the threshold levels have been determined, each of the values of T(w) are set to either 1 (if a grey level of w signifies a defect because it is outside the noise thresholds) or 0 (for no defect) by microcontroller 2 (142) and those values stored in register 144.

Stage 7

In this stage of the operation, the processed sub-image is thresholded and the defective pixels are merged into defects. The presence of a defect at a pixel site can be determined by interpreting the 8 bits of the processed sub-image values that were used to form the histograms, an 8-bit number w. If T(w)=0 then there is no defect at the pixel site and if T(w)=1 then there is a defect at that pixel site. Since a defect may be larger than a single pixel in size, pixels that are close together wherein each is identified as having a defect, a single defect is identified that occurs in more than one pixel of the processed sub-image. The location, grey level and defect membership of all of the defective pixels are then stored.

Microcontroller 3 (146) directs the search of all of the 256×256 pixels of the sub-image from RAM 4 (136) for defects in conjunction with the values of T in thresholding look-up-table 144, and stores the results in RAM 5 (148). As with the other microcontrollers, microcontroller 3 (146) is dedicated to this stage and can run in isolation except for the requirement that it be synchronized with the operation of the rest of the system.

The input to this stage is the processed sub-image and the output is a list of defects that contain all of the information about the defects that is obtainable from the transform method of the present invention without the need for an intermediate binary image. The search will proceed by raster-scanning the sub-image until a defect is found and than a search in the region around the defect for more defective pixels belonging to the same defect. To prevent multiple reportings of a single defective pixel, the pixel histogram value, H, is replaced by a non-defective value in the processed image once it is found.

Stage 8

This, the final stage, reports the defects to the main processor 64, and performs defect classification, if desired. This function is performed by microcontroller 4 (150) with it dedicated to this stage and it can run in isolation except for synchronization with the rest of the system, as is the case with each of the other microcontrollers.

If additional classification is required then additional microcontroller stages can be added here at a low cost. Such additional stages could, for example, perform classification tasks utilizing statistical information from previously processed sub-images.

Column 2 of FIG. 1 is identical to column 1 in all respects (even in the use of the same filters, parameters for analysis, timing masks, etc.) except for the addition of shifting filter 22—which functions as described above to align the two images. Shifting filter 22 uses trigonometry operating on $\Delta x$ and $\Delta y$ to align the two images by adjusting the phases of the 2-dimensional sinusoids specified by the transform of FOV2.

Figure 8:
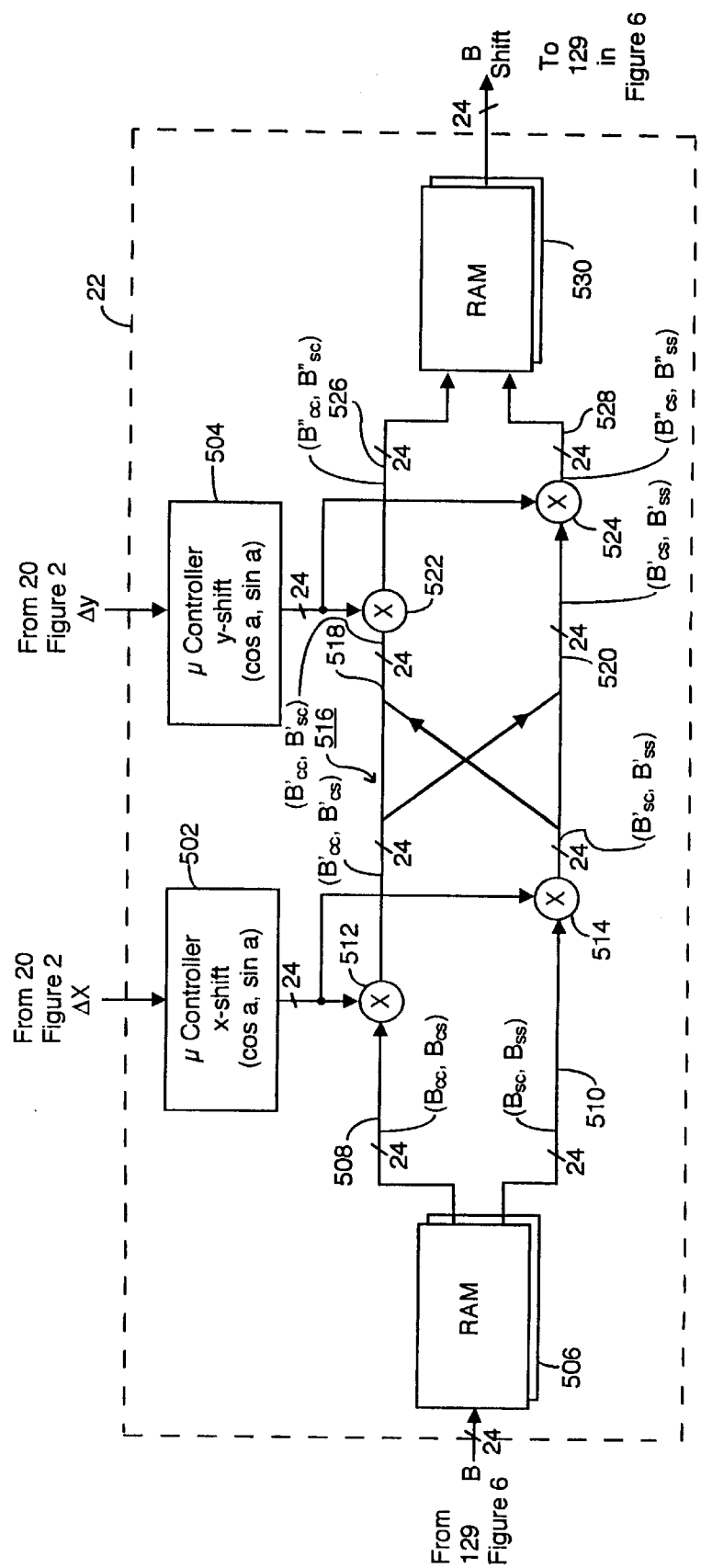
FIG. 8 is a block diagram that illustrates the shifting filter for addition to the block diagram of FIG. 5 to perform the function of processing FOV2 of FIG. 1.

FIG. 8 illustrates the addition of shifting filter 22 (FIG. 1 FOV2) to the pipeline diagram of FOV1 in FIG. 5 to convert that diagram for use for FOV2 of column 2. The diagram of FIG. 8 for FOV2 operation is inserted serially in line 129 between multiplier 128 and FBTinverse 1 130 as indicated in FIG. 8. The implementation in FIG. 8 is only one of many implementations that might be made and this implementation is included here for illustration purposes.

Referring to FIG. 8, the FOV2 signal, after the removal of the harmonics, on line 129 is applied to a double buffer input RAM 506, and the $\Delta x$ and $\Delta y$ signals from the third column of FIG. 1 are applied to $\mu$controller (x-shift) 502 and $\mu$controller (y-shift) 504, respectively. Each of $\mu$controllers 502 and 504 compute the angles $a_1$ and $a_2$, respectively, from $\Delta x$ and $\Delta y$, and the sin and cos functions of the corresponding angle. From RAM 506 the signals $B_{CC}$ and $B_{CS}$ are on bus 508 and the signals $B_{SC}$ and $B_{SS}$ are on bus 510 for application to complex number multipliers 512 and 514, and cross-over circuit 516 to generate the signals $B'_{CC}(v_2,v_1)$ and $B'_{SC}(v_2,v_1)$ on bus 518, and $B'_{CS}(v_2,v_1)$ and $B'_{SS}(v_2,v_1)$ on bus 520, as per the following equations for $v_2=0, 1, \ldots, 128$ and $v_1=0, 1, \ldots, 128$, $B'_{CC}(v_2,v_1)=\cos(a_1)B_{CC}(v_2,v_1)-\sin(a_1)B_{CS}(v_2,v_1)$ $B'_{CS}(v_2,v_1)=\sin(a_1)B_{CC}(v_2,v_1)+\cos(a_1)B_{CS}(v_2,v_1)$ $B'_{SC}(v_2,v_1)=\cos(a_1)B_{SC}(v_2,v_1)-\sin(a_1)B_{SS}(v_2,v_1)$ $B'_{SS}(v_2,v_1)=\sin(a_1)B_{SC}(v_2,v_1)+\cos(a_1)B_{SS}(v_2,v_1)$ resulting in the $B'_{CC}$ and $B'_{SC}$ signals on bus 518, and the $B'_{CS}$ and $B'_{SS}$ signals on bus 520. Complex multipliers 522 and 524 then multiply ($\cos a_2$, $\sin a_2$) with the signals on buses 518 and 520 to generate $B''_{CC}$ and $B''_{SC}$ signals on bus 526, and the $B''_{CS}$ and $B''_{SS}$ signals on bus 528 as per the following equations for $v_2=0, 1, \ldots, 128$ and $v_1=0, 1, \ldots, 128$, $B''_{CC}(v_2,v_1)=\cos(a_2)B'_{CC}(v_2,v_1)-\sin(a_2)B'_{SC}(v_2,v_1)$ $B''_{SC}(v_2,v_1)=\sin(a_2)B'_{CC}(v_2,v_1)+\cos(a_2)B'_{SC}(v_2,v_1)$ $B''_{CS}(v_2,v_1)=\cos(a_2)B'_{CS}(v_2,v_1)-\sin(a_2)B'_{SS}(v_2,v_1)$ $B''_{SS}(v_2,v_1)=\sin(a_2)B'_{CS}(v_2,v_1)+\cos(a_2)B'_{SS}(v_2,v_1)$ where $a_1=2\pi v_1\Delta x/W$ and $a_2=2\pi v_2\Delta y/H$ Those signals are then applied to double buffered RAM 530 for application of the shifted signals to FBTinverse 1 130 of FIG. 5 (inverse transform block 10' of FIG. 1).

Note that the x variable is associated with the width W, the subscript 1 and the last subscript on the B's; and that the y variable is associated with the height H, the subscript 2 and the first subscript on the B's. That is, the 2-D sinusoid $B_{CC}(v_2, v_1)\cos(2\pi v_2 y/H)\cos(2\pi v_1 x/W) +$ $B_{CS}(v_2, v_1)\cos(2\pi v_2 y/H)\sin(2\pi v_1 x/W) +$ $B_{SC}(v_2, v_1)\sin(2\pi v_2 y/H)\cos(2\pi v_1 x/W) +$ $B_{SS}(v_2, v_1)\sin(2\pi v_2 y/H)\sin(2\pi v_1 x/W)$ in the unshifted image becomes the 2-D sinusoid $B''_{CC}(v_2, v_1)\cos(2\pi v_2[y-\Delta y]/H)\cos(2\pi v_1[x-\Delta x]/W) +$ $B''_{CS}(v_2, v_1)\cos(2\pi v_2[y-\Delta y]/H)\sin(2\pi v_1[x-\Delta x]/W) +$ $B''_{SC}(v_2, v_1)\sin(2\pi v_2[y-\Delta y]/H)\sin(2\pi v_1[x-\Delta x]/W) +$ $B''_{SS}(v_2, v_1)\sin(2\pi v_2[y-\Delta y]/H)\sin(2\pi v_1[x-\Delta x]/W)$ in the shifted image.

Figure 9A:
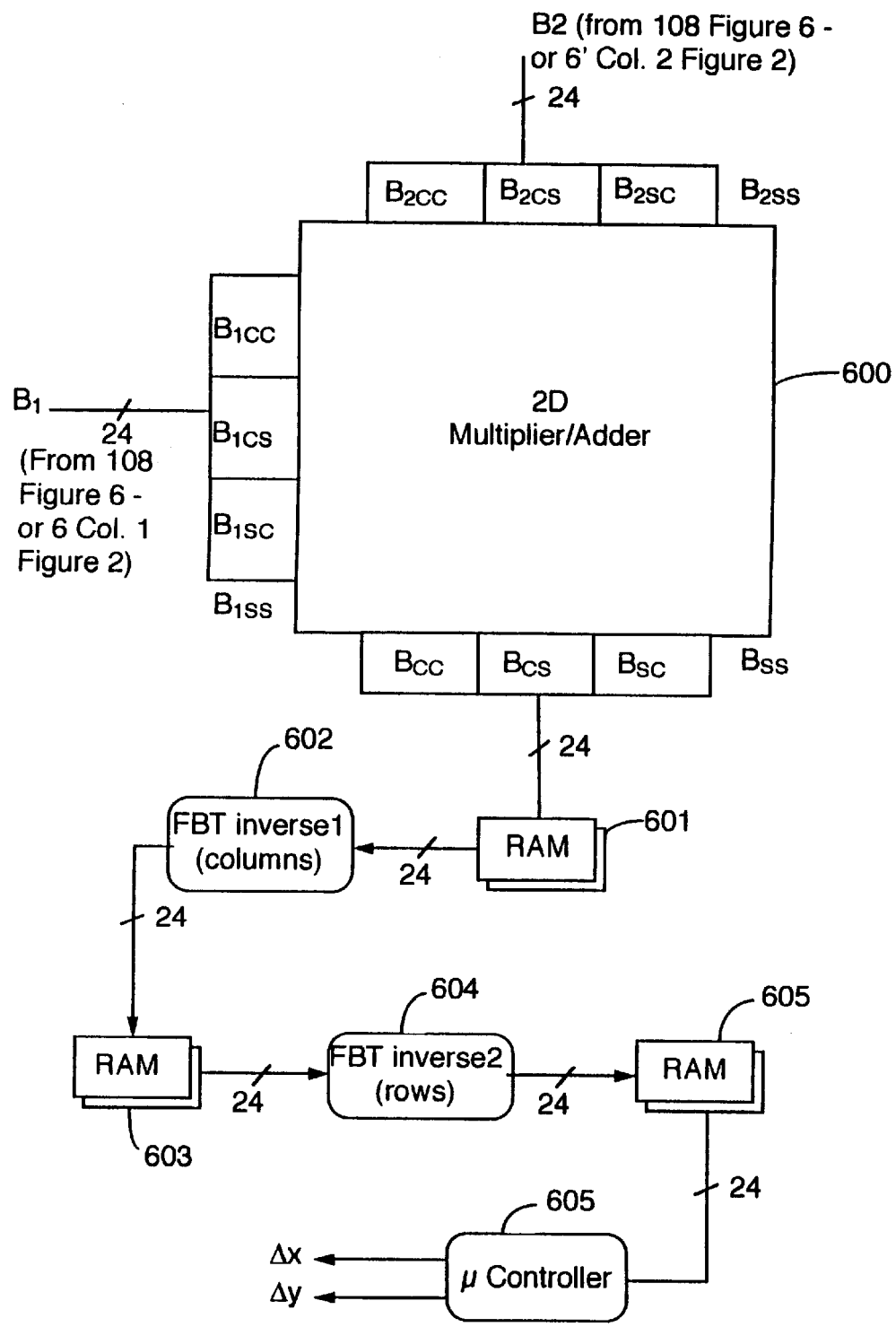
FIG. 9a is a block diagram that illustrates the functions of the upper portion of the third column of FIG. 1 in pipeline format.
Figure 9B:
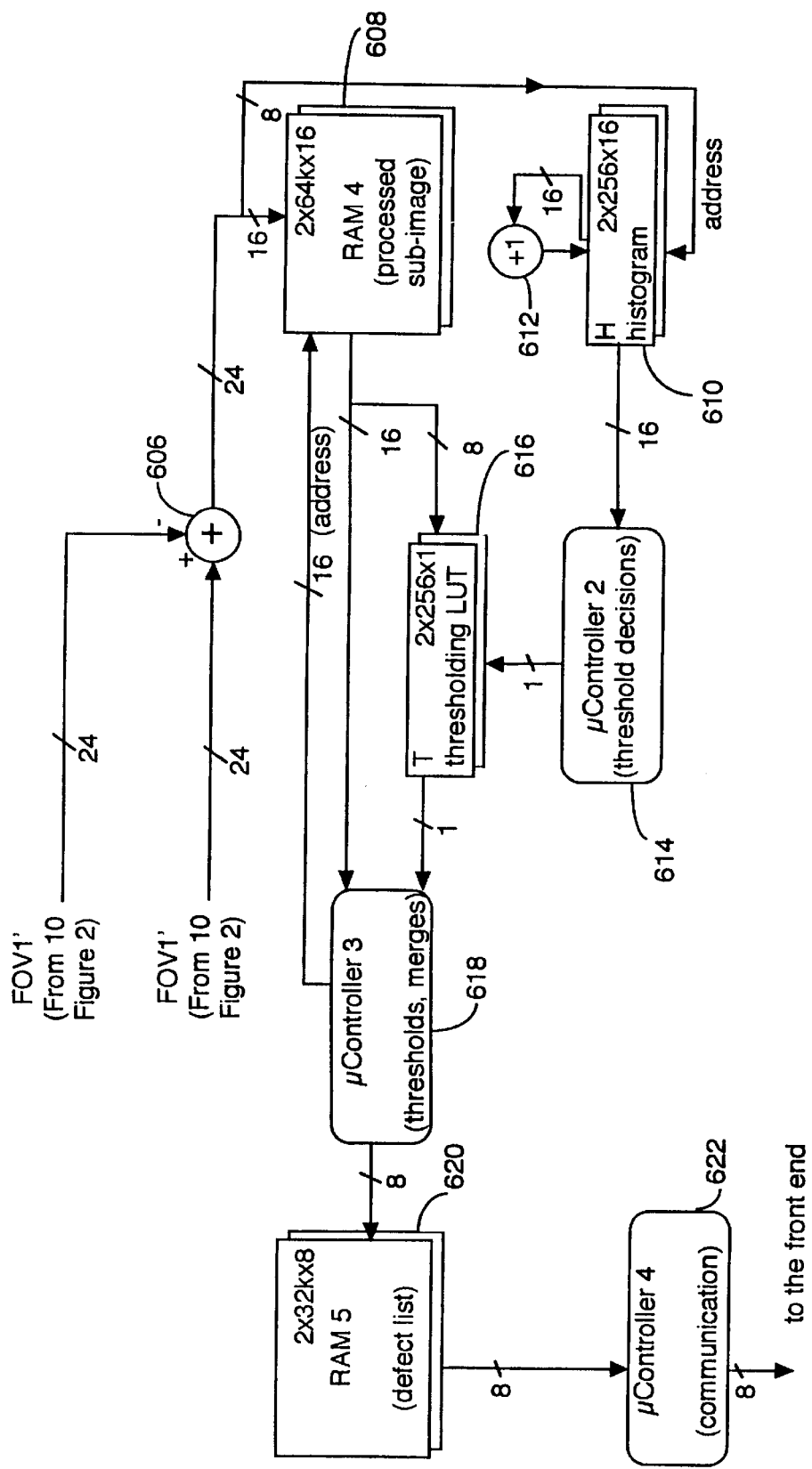
FIG. 9b is a block diagram that illustrates the functions of the lower portion of the third column of FIG. 1 in pipeline format.

FIGS. 9a and 9b are provided to illustrate the functions of the upper and lower portions of the blocks in the third column of FIG. 1, respectively. FIG. 9a, and the upper portion of the third column of FIG. 1, calculate any offset that exists between the images of the two fields of view, FOV1 and FOV2, and provides a real number for each value, $\Delta x$ and $\Delta y$, to shifting filter 22 in the second column of FIG. 1 or to $\mu$controllers 502 and 504, respectively, of FIG. 8. This is performed by first conjugating and multiplying the transformed signals from transform blocks 6 and 6' in the first and second columns of FIG. 1 by 2D multiplier/adder 600 as per the following equations.

The details of the conjugation and multiplication operations, for the canonical transform, are as follows. Let $B_1(v_2,v_1)$ be the 2-D canonical transform of FOV1, let B2 $(v_2,v_1)$ be the 2-D canonical transform of FOV2, and let B2 $(v_2,v_1)$ be the 2-D canonical transform of the correlation surface of FOV1 and FOV2. Then, for $v_2=0,1\ldots,128$ and $v_1=0, 1, \ldots, 128$, $B_{CC}(v_2, v_1) = B_{1CC}(v_2, v_1) * B_{2CC}(v_2, v_1) +$ -continued $$B_{1CS}(v_2, v_1) * B_{2CS}(v_2, v_1) +$$
$$B_{1SC}(v_2, v_1) * B_{2SC}(v_2, v_1) +$$
$$B_{1SS}(v_2, v_1) * B_{2SS}(v_2, v_1)$$
$$B_{CS}(v_2, v_1) = B_{1CC}(v_2, v_1) * B_{2CS}(v_2, v_1) -$$
$$B_{1CS}(v_2, v_1) * B_{2CC}(v_2, v_1) +$$
$$B_{1SC}(v_2, v_1) * B_{2SS}(v_2, v_1) -$$
$$B_{1SS}(v_2, v_1) * B_{2SC}(v_2, v_1)$$
$$B_{SC}(v_2, v_1) = B_{1CC}(v_2, v_1) * B_{2SC}(v_2, v_1) +$$
$$B_{1CS}(v_2, v_1) * B_{2SS}(v_2, v_1) -$$
$$B_{1SC}(v_2, v_1) * B_{2CC}(v_2, v_1) -$$
$$B_{1SS}(v_2, v_1) * B_{2CS}(v_2, v_1)$$
$$B_{SS}(v_2, v_1) = B_{1CC}(v_2, v_1) * B_{2SS}(v_2, v_1) -$$
$$B_{1CS}(v_2, v_1) * B_{2SC}(v_2, v_1) -$$
$$B_{1SC}(v_2, v_1) * B_{2CS}(v_2, v_1) +$$
$$B_{1SS}(v_2, v_1) * B_{2CC}(v_2, v_1)$$

There are several possible implementations of this operation, of which the straightforward arrangement shown in FIG. 9a is one. The multipliers and adders shown in FIG. 9a are for 24-bit real arithmetic.

The combined surface characteristics of the two surfaces of FOV1 and FOV2 from 2D multiplier/adder 600 is then applied to RAM 601, followed by serial application to FBTinverse1 (columns) 602, RAM 603, FBTinverse 2 (rows) 604 and RAM 605 for double buffering the combined images in the same way that the same blocks 130–136 of FIG. 5. The combined image from RAM 605 is then applied to $\mu$controller 605 for detection of the highest peaks on the combined surface, to determine the location of those points and to report them to within a few hundredths of a pixel as $\Delta x$ and $\Delta y$ to align the image of FOV2 with that of FOV1.

The lower portion of the third column of FIG. 1, as discussed above, is provided to present the difference between FOV1' and FOV2' in the spatial domain, where FOV1' and FOV2' are the images in the first and second column of FIG. 1, respectively, after the repeating patterns have been removed. One implementation for performing that function is shown in FIG. 9b with FOV1' and FOV2' applied to adder 606 to form the difference image. The combined image is then applied to blocks 608–622, which function in the same way as blocks 136–150 of FIG. 5, to provide the defects which are presumed to be the differences between FOV1 and FOV2. From that point the resulting defect list from FIG. 9b is combined with those from blocks 14 and 14' of FIG. 1, and as discussed above, to generate the complete defect list for the two images.

The present invention also includes the ability to do device pattern inspection within a single device pattern, where the pattern to be inspected is a repeating pattern. That can be done by either a subset of the present device, namely the FOV1 column from FIG. 1, or doing two (possibly different) patterns at once using columns FOV1 and FOV2 of FIG. 1. That is, just apply the 'transform method' wherein the hybrid algorithm is a combination of the transform method and die-to-die comparison.

In the above discussion of the method and apparatus of the inspection system of the present invention the handling of only the first two rows and columns where discussed for simplicity. In actual operation there is no difference between the handling of any adjacent pair of rows and columns, including the first and the last. Each adjacent pair of rows and columns are processed in the same way as any other pair.

While the discussion above has been focused on the use of canonical transforms, it should be noted that any type of sinusoidal (Fourier-like) transform could be used—Fourier, canonical, Hartley, cosine or sine. There are an infinite number of such transforms—they are all characterized by the fact that they represent an image as a sum of two-dimensional sinusoids (i.e. they transform the image into a number of sinusoidally-varying functions of x and y that, when all added together, equal the image). The cost of using a complex transform (such as the Fourier transform) compared to a real-only transform (such as the canonical or Hartley transforms) is to double the amount of computation that needs to be done, which results in twice as many FFT chips in the implementation.

Any of these infinite number of transforms, both complex and real-only, can be cheaply computed using an FFT (Fast Fourier Transform) chip, and all of the transforms are tools for doing 'Fourier analysis' which is not to be confused with having to use the Fourier transform. The cheapest and easiest transform to use is the canonical transform which is why the above discussion used it to explain the present invention. If the Fourier transform were to be used, for example, it would result in a cost of slightly more than twice as much computation as with the canonical transform.

With the present invention to perform the inspection process with greatest accuracy a uniform illumination is necessary of the region being inspected. Thus, to insure that occurs the inspection area should be smaller than the illumination area. Further, the present invention is independent of whether the area of the substrate that is involved in the inspection is a full or a sub die, or multiple dies. Additionally, the present invention lends itself to the inspection intra- or inter-die, or a combination of both.

The transformations and reverse transformations discussed above could be performed in either the analog or the digital domain. Analog transformations are well known in the art, and digital transformations may be somewhat less well known. However, digital transformation techniques are well documented in R. N. Bracewell, "The Hartley Transform", 1986, Oxford Univ. Press, Oxford, Eng., and R. N. Bracewell, "The Fourier Transform", 1965, Oxford Univ. Press, Oxford, Eng.

It should also be understood that the present invention is not limited to being used to inspect semiconductor substrates. This invention, and each of its embodiments have application to the inspection of any surface where it is important that the pattern be reliably repeatable between individual pieces. Thus, the present invention can be used to inspect wafers of various forms and materials, and reticles, photomasks, flat panels, and any other device that the user may be interested in inspecting for consistency one to another.

While the above discussion has attempted to describe and illustrate several alternative embodiments and implementations of the present invention, it is not possible to illustrate or to anticipate all embodiments and applications of the present invention. However, with the disclosure provided the necessary changes that would be needed to various other embodiments and applications would be obvious to one skilled in the art. Therefore, the scope of protection for the present invention is not to be limited by the scope of the above discussion, but rather by the scope of the appended claims.

What is claimed is:

1. In an inspection system for detecting defects in devices of any type having either random, repeating or mixed patterns within the same device, said inspection system includes first and second fields of view each positioned along a different optic axis, the first field of view creates a first spatial domain pixel map of a portion of a first substrate pattern; and said second field of view provides a second spatial domain pixel map against which said first substrate pattern is to be checked from either a pre-stored pixel map of the desired pattern, a scaled drawing of the desired pattern, a repeating pattern within the same device on said first substrate as in said first field of view, a pattern within a different device on said first substrate as in said first field of view, or a second substrate pattern; a method for detecting defects in said first substrate pattern in said first field of view comprising the steps of:

a. generating a residual spatial domain pixel map by subtracting one of said first and second spatial domain pixel maps from the other of said first and second spatial domain pixel maps;

b. determining the pixel gray level histogram of said residual spatial domain pixel map of step a.;

c. fitting the histogram of step b. to an exponential distribution function;

d. determining a threshold amplitude that is above the expected noise level and below the expected defect level from said exponential distribution function of step c.; and e. thresholding said residual spatial domain pixel map of step a. with the determined threshold from step d. to identify all of those values that exceed said threshold as defects in said first spatial domain pixel map.

2. In an inspection system for detecting defects in devices of any type having either random, repeating or mixed patterns within the same device, said inspection system includes first and second fields of view each positioned along a different optic axis, the first field of view creates a first spatial domain pixel map of a portion of a first substrate pattern; and said second field of view provides a second spatial domain pixel map against which said first substrate pattern is to be checked from either a pre-stored pixel map of the desired pattern, a scaled drawing of the desired pattern, a repeating pattern within the same device on said first substrate as in said first field of view, a pattern within a different device on said first substrate as in said first field of view, or a second substrate pattern; a method for detecting defects in said first substrate pattern in said first field of view comprising the steps of:

a. generating a residual spatial domain pixel map by removing the repeating pattern from said first spatial domain pixel map;

b. determining the pixel gray level histogram of said residual spatial domain pixel map of step a.;

c. fitting the histogram of step b. to an exponential distribution function;

d. determining a threshold amplitude that is above the expected noise level and below the expected defect level from said exponential distribution function of step c.; and e. thresholding said residual spatial domain pixel map of step a. with the determined threshold from step d. to identify all of those values that exceed said threshold as defects in said first spatial domain pixel map.

3. An inspection system for detecting defects in devices of any type having either random, repeating or mixed patterns within the same device comprising:

a processor for controlling the operation of said inspection system;

first and second fields of view means each under the control of said processor and each positioned along a different optic axis, the first field of view for creating a first spatial domain pixel map of a first substrate pattern, and said second field of view for providing a second spatial domain pixel map against which said first substrate pattern is to be checked from either a pre-stored pixel map of the desired pattern, a scaled drawing of the desired pattern, a repeating pattern within the same device on said first substrate as in said first field of view, a pattern within a different device on said first substrate as in said first field of view, or a second substrate pattern;

generation means for generating a residual spatial domain pixel map by subtracting one of said first and second spatial domain pixel maps from the other of said first and second spatial domain pixel maps;

histogram means for determining the pixel gray level histogram of said residual spatial domain pixel map of said generation means;

fitting means for fitting the histogram of the histogram means to an exponential distribution function;

selection means for determining a threshold amplitude that is above the expected noise level and below the expected defect level from said exponential distribution function of said fitting means; and thresholding means for thresholding said residual spatial domain pixel map with the determined threshold to identify all of those values that exceed said threshold as defects in said first spatial domain pixel map.

4. An inspection system for detecting defects in devices of any type having either random, repeating or mixed patterns within the same device comprising:

a processor for controlling the operation of said inspection system;

first and second fields of view means each under the control of said processor and each positioned along a different optic axis, the first field of view for creating a first spatial domain pixel map of a first substrate pattern, and said second field of view for providing a second spatial domain pixel map against which said first substrate pattern is to be checked from either a pre-stored pixel map of the desired pattern, a scaled drawing of the desired pattern, a repeating pattern within the same device on said first substrate as in said first field of view, a pattern within a different device on said first substrate as in said first field of view, or a second substrate pattern;

generation means for generating a residual spatial domain pixel map by removing the repeating pattern from said first spatial domain pixel map;

histogram means for determining the pixel gray level histogram of said residual spatial domain pixel map of said generation means;

fitting means for fitting the histogram of the histogram means to an exponential distribution function;

selection means for determining a threshold amplitude that is above the expected noise level and below the expected defect level from said exponential distribution function of said fitting means; and thresholding means for thresholding said residual spatial domain pixel map with the determined threshold to identify all of those values that exceed said threshold as defects in said first spatial domain pixel map.

* * * * *